(12) United States Patent
Miyashita et al.

(10) Patent No.: US 9,228,255 B2
(45) Date of Patent: Jan. 5, 2016

(54) FEPT-C-BASED SPUTTERING TARGET AND PROCESS FOR PRODUCING THE SAME

(71) Applicant: TANAKA KIKINZOKU KOGYO K.K., Tokyo (JP)

(72) Inventors: Takanobu Miyashita, Tsukuba (JP); Yasuyuki Goto, Tsukuba (JP); Ryousuke Kushibiki, Tsukuba (JP); Masahiro Aono, Tsukuba (JP); Masahiro Nishiura, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 38 days.

(21) Appl. No.: 14/311,934

(22) Filed: Jun. 23, 2014

(65) Prior Publication Data

US 2014/0301887 A1    Oct. 9, 2014

Related U.S. Application Data

(62) Division of application No. 14/008,211, filed as application No. PCT/JP2012/056726 on Mar. 15, 2012, now Pat. No. 8,858,674.

(30) Foreign Application Priority Data

Mar. 30, 2011  (JP) ................................. 2011-076829
Jan. 13, 2012  (JP) ................................. 2012-005696

(51) Int. Cl.
| | |
|---|---|
| *B22F 3/12* | (2006.01) |
| *C23C 14/34* | (2006.01) |
| *C22C 5/04* | (2006.01) |
| *C22C 1/04* | (2006.01) |
| *C22C 33/02* | (2006.01) |

(52) U.S. Cl.
CPC ........... *C23C 14/3414* (2013.01); *C22C 1/0466* (2013.01); *C22C 5/04* (2013.01); *C22C 33/0278* (2013.01); *B22F 2998/10* (2013.01); *B22F 2999/00* (2013.01)

(58) Field of Classification Search
None
See application file for complete search history.

(56) References Cited

U.S. PATENT DOCUMENTS

2006/0110626 A1 *  5/2006  Ziani ................... B32B 15/01
                                                         428/832.2
2007/0189916 A1    8/2007  Zhang
2009/0053089 A1 *  2/2009  Yang .................... C22C 1/05
                                                         419/13
2009/0242393 A1   10/2009  Satoh
2013/0213803 A1    8/2013  Sato et al.

FOREIGN PATENT DOCUMENTS

| | | |
|---|---|---|
| JP | A-5-311413 | 11/1993 |
| JP | A-6-81010 | 3/1994 |
| JP | A-6-81011 | 3/1994 |
| JP | A-8-157904 | 6/1996 |
| JP | A-10-338573 | 12/1998 |
| JP | A-2003-313659 | 11/2003 |
| JP | A-2006-161082 | 6/2006 |
| JP | A-2006-517612 | 7/2006 |
| JP | B2-3950838 | 8/2007 |
| JP | A-2008-127591 | 6/2008 |
| JP | A-2008-169464 | 7/2008 |
| JP | A-2008-189996 | 8/2008 |
| JP | A-2012-102387 | 5/2012 |
| TW | 200728483 A | 8/2007 |
| TW | 201229274 A | 7/2012 |

OTHER PUBLICATIONS

International Search Report issued in International Application No. PCT/JP2012/056726 on Jun. 12, 2012 (with translation).

Hu et al., "Exchange coupling assisted FePtC perpendicular recording media," *Applied Physics Letters*, 2008, vol. 93, pp. 072504-072504-3, American Institute of Physics.

Jiang et al., "Magnetic Properties of Isolated FePt-C Nanocomposited Films," *IEEE Transactions on Magnetics*, Jun. 2010, vol. 46, No. 6, pp. 1914-1917, IEEE.

Chen et al., "Low temperature deposited L10 FePt-C (001) films with high coercivity and small grain size," *Applied Physics Letters*, 2007, vol. 91, pp. 132506-132506-3, American Institute of Physics.

Mi et al., "Characterization of Cu additive FePT-C granular films," *Applied Surface Science*, 2006, vol. 252, pp. 8688-8694, Elsevier B.V.

Information Offer Form, submitted by third party on Apr. 28, 2014 (w/ translation).

* cited by examiner

*Primary Examiner* — George Wyszomierski
*Assistant Examiner* — Ngoclan T Mai
(74) *Attorney, Agent, or Firm* — Oliff PLC

(57) ABSTRACT

An FePt—C-based sputtering target contains Fe, Pt, and C and has a structure in which an FePt-based alloy phase and a C phase containing unavoidable impurities are mutually dispersed, the FePt-based alloy phase containing Pt in an amount of 40 at % or more and 60 at % or less with the balance being Fe and unavoidable impurities. The content of C is 21 at % or more and 70 at % or less based on the total amount of the target.

33 Claims, 6 Drawing Sheets

FEPT-C-BASED SPUTTERING TARGET AND PROCESS FOR PRODUCING THE SAME

CROSS-REFERENCE TO RELATED APPLICATION

This application is a divisional of application Ser. No. 14/008,211, filed Sep. 27, 2013, the entire content of which is incorporated herein by reference.

TECHNICAL FIELD

The present invention relates to a FePt—C-based sputtering target and to a process for producing the same.

BACKGROUND ART

A FePt alloy can be provided with the fct (Ordered Face Centered Tetragonal) structure which has high crystal magnetic anisotropy by heat-treating at an elevated temperature (for example, at 600° C. or higher), and therefore a FePt alloy has been highlighted as a magnetic recording medium. To make FePt particles smaller and more uniform in the thin film of the FePt alloy, it is proposed that a predetermined quantity of carbon (C) be included into the thin film of the FePt alloy (for example, Patent Literature 1).

However, the formation method of the FePtC thin film, described in the Patent Literature 1, is the method of vapor-depositing Fe, Pt, and C simultaneously on a MgO (100) board by using the Fe target of a 2-inch diameter, C target of a 2-inch diameter, and the Pt target of 5 mm in height and width. In this method, it is difficult to obtain the film whose composition is controlled strictly. Additionally, three targets are required and each target needs a cathode, a power supply, etc, and so the cost of equipment becomes high while the preparatory work of sputtering takes time and effort.

On the other hand, the technology for producing the sputtering target consisting of a PtFe system alloy according to a casting process is described in the Patent Literature 2. And in claim 2, 3 and the paragraph 0017 of a Patent Literature 2, C is raised as one choice in the many choice of the element added into a PtFe-based alloy.

However, C is only raised as one of the many choices of the element added into a PtFe-based alloy, and the specific working example in which C is actually added into the PtFe-based alloy is not shown. Even if C can be added into a PtFe-based alloy in the technology described in the Patent Literature 2, the content of carbon (C) in a FePt—C sputtering target is 20 at % at the maximum as described in claim 2, 3 and the paragraph 0017 of a Patent Literature 2.

CITATION LIST

Patent Literature

Patent Literature 1: Japanese Patent No. 3950838
Patent Literature 2: Japanese Patent Application Laid-Open No. 2006-161082

SUMMARY OF INVENTION

Technical Problem

The present invention has been made in view of the aforementioned problems. It is an object of the present invention to provide an FePt—C-based sputtering target which enables an FePtC-based thin film containing a large amount of carbon to be formed from a single target without using a plurality of targets, and to provide a process for producing the FePt—C-based sputtering target.

Solution to Problem

As a result of intensive research to solve the aforementioned problem, the present inventors found out that the aforementioned problem is solvable with the following FePt—C-based sputtering targets and solvable with the following processes for producing the FePt—C-based sputtering target, and the present inventors created the present invention.

Namely, a first aspect of an FePt—C-based sputtering target according to the present invention is an FePt—C-based sputtering target containing Fe, Pt, and C, wherein the FePt—C-based sputtering target has a structure in which an FePt-based alloy phase and a C phase containing unavoidable impurities are mutually dispersed, the FePt-based alloy phase containing Pt in an amount of 40 at % or more and 60 at % or less with the balance being Fe and unavoidable impurities, and wherein C is contained in an amount of 21 at % or more and 70 at % or less based on the total amount of the target.

The phrase "an FePt-based alloy phase and a C phase containing unavoidable impurities are mutually dispersed" is a concept including a state in which the FePt-based alloy phase is a dispersion medium and the C phase is a dispersoid and a state in which the C phase is a dispersion medium and the FePt-based alloy phase is a dispersoid and further including a state in which the FePt-based alloy phase and the C phase are mutually mixed but it is not possible to determine which phase is a dispersion medium and which phase is a dispersoid.

In the present description, the term "FePt-based alloy" means an alloy containing Fe and Pt as main components and is meant to include not only binary alloys containing only Fe and Pt but also ternary and higher alloys containing Fe and Pt as main components and further containing a metal element other than Fe and Pt. The term "FePt—C-based sputtering target" means a sputtering target containing Fe, Pt, and C as main components. The term "FePtC-based thin film" means a thin film containing Fe, Pt, and C as main components.

A second aspect of an FePt—C-based sputtering target according to the present invention is an FePt—C-based sputtering target containing Fe, Pt, and C and further containing one or more kinds of metal elements other than Fe and Pt, wherein the FePt—C-based sputtering target has a structure in which an FePt-based alloy phase and a C phase containing unavoidable impurities are mutually dispersed, the FePt-based alloy phase containing Pt in an amount of 40 at % or more and less than 60 at % and the one or more kinds of metal elements other than Fe and Pt in an amount of more than 0 at % and 20 at % or less with the balance being Fe and unavoidable impurities and with the total amount of Pt and the one or more kinds of metal elements being 60 at % or less, and wherein C is contained in an amount of 21 at % or more and 70 at % or less based on the total amount of the target.

In the second aspect of the FePt—C-based sputtering target according to the present invention, the one or more metal elements other than Fe and Pt may be one or more kinds of Cu, Ag, Mn, Ni, Co, Pd, Cr, V, and B. The one or more metal elements other than Fe and Pt may include Cu, or the one or more metal elements other than Fe and Pt may be only Cu.

Preferably, the C phase has an average phase size of 0.6 μm or less as determined by an intercept method.

A method for determining the average size of the C phase by the intercept method will be described later in

DESCRIPTION OF EMBODIMENTS

Preferably, the FePt—C-based sputtering target has a relative density of 90% or higher.

Preferably, the content of oxygen is 100 mass ppm or less based on the total mass of the target. Preferably, the content of nitrogen is 30 mass ppm or less based on the total mass of the target.

Some of the above-described FePt—C-based sputtering targets can be preferably used for a magnetic recording medium.

A first aspect of a process for producing an FePt—C-based sputtering target according to the present invention is a process for producing an FePt—C-based sputtering target, including: adding C powder containing unavoidable impurities to FePt-based alloy powder containing Pt in an amount of 40 at % or more and 60 at % or less with the balance being Fe and unavoidable impurities; mixing the C powder and the FePt-based alloy powder in an atmosphere containing oxygen to produce a powder mixture; and then molding the produced powder mixture while the powder mixture is heated under pressure.

And, a second aspect of a process for producing an FePt—C-based sputtering target according to the present invention is a process for producing an FePt—C-based sputtering target, including: adding C powder containing unavoidable impurities to FePt-based alloy powder containing Pt in an amount of 40 at % or more and less than 60 at % and one or more kinds of metal elements other than Fe and Pt in an amount of more than 0 at % and 20 at % or less with the balance being Fe and unavoidable impurities and with the total amount of Pt and the one or more kinds of metal elements being 60 at % or less; mixing the C powder and the FePt-based alloy powder in an atmosphere containing oxygen to produce a powder mixture; and then molding the produced powder mixture while the powder mixture is heated under pressure.

In the second aspect of the process for producing an FePt—C-based sputtering target according to the present invention, the one or more metal elements other than Fe and Pt may be one or more kinds of Cu, Ag, Mn, Ni, Co, Pd, Cr, V, and B. The one or more metal elements other than Fe and Pt may include Cu, or the one or more metal elements other than Fe and Pt may be only Cu.

The C powder may be added such that the content of C is, for example, 21 at % or more and 70 at % or less based on the total amount of the powder mixture.

Preferably, oxygen is supplied to the atmosphere from outside of the atmosphere. This can prevent a shortage of oxygen in the atmosphere and can suppress ignition of the C powder.

The oxygen may be supplied by supplying air. The use of air as the supply source of oxygen can reduce cost.

The atmosphere may be air. When the atmosphere is air, the cost can be reduced.

The atmosphere may not be air but may be an atmosphere composed substantially of an inert gas and oxygen. In this case, incorporation of impurities other than oxygen into the powder mixture during the mixing can be suppressed.

The concentration of oxygen in the atmosphere may be, for example, 10 vol % or higher and 30 vol % or lower.

The atmosphere may be released into the air during the mixing. In this case, even when the atmosphere is short of oxygen during the mixing, oxygen can be introduced from the air by releasing the atmosphere into the air, so that the shortage of oxygen can be mitigated.

Preferably, the C phase in the obtained FePt—C-based sputtering target has an average phase size of 0.6 µm or less as determined by an intercept method.

Preferably, an atmosphere when the powder mixture is molded while heated under pressure is a vacuum or an inert gas atmosphere. In this manner, the amount of impurities such as oxygen in the obtained sintered product can be reduced.

Preferably, the content of oxygen in the obtained FePt—C-based sputtering target is 100 mass ppm or less. Preferably, the content of nitrogen in the obtained FePt—C-based sputtering target is 30 mass ppm or less.

Preferably, the FePt-based alloy powder is produced by an atomizing method, in terms of a reduction in the amount of impurities mixed. Preferably, the atomizing method is performed using argon gas or nitrogen gas, in terms of a further reduction in the amount of impurities mixed.

Some of the obtained FePt—C-based sputtering targets can be preferably used for a magnetic recording medium.

A third aspect of the FePt—C-based sputtering target according to the present invention is an FePt—C-based sputtering target produced by any one of the above production processes.

Advantageous Effects of Invention

An FePt—C-based thin film with a high carbon content can be formed by using the FePt—C-based sputtering target according to the present invention alone, i.e., by using only this target without using a plurality of targets.

In the process for producing an FePt—C-based sputtering target according to the present invention, the FePt-based alloy powder and the C powder are mixed in an atmosphere containing oxygen to produce a powder mixture. Therefore, the FePt—C-based sputtering target can be produced stably with ignition of the C powder being suppressed. Since Fe and Pt are alloyed, ignition of Fe during mixing with the C powder can also be suppressed.

DESCRIPTION OF EMBODIMENTS

Figure 1:
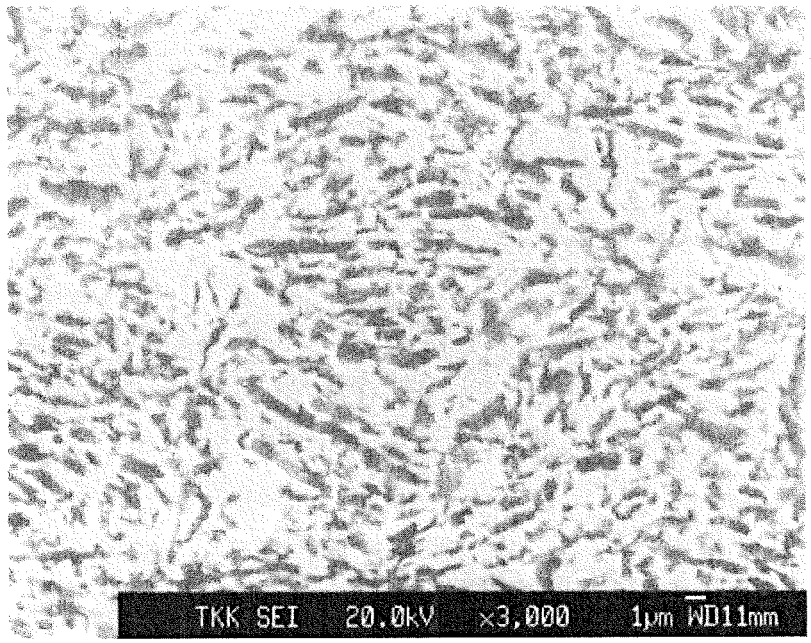
FIG. 1 is a low-magnification scanning electron micrograph (an image taken at a magnification of 3,000×) of the structure of a sintered product in Example 1 (the cumulative number of ball mill revolutions: 4,136,400, sintering temperature: 1,460° C.) (a bar scale in the photograph: 1 µm).

Embodiments of the present invention will next be described in detail.

1. First Embodiment

1-1. Components and Structure of Sputtering Target

An FePt—C-based sputtering target according to a first embodiment of the present invention contains Fe, Pt, and C (carbon). The FePt—C-based sputtering target is characterized in that it has a structure in which an FePt alloy phase and a C phase containing unavoidable impurities are mutually dispersed, the FePt alloy phase containing Pt in an amount of 40 at % or more and 60 at % or less with the balance being Fe and unavoidable impurities, and that the content of C is 21 at % or more and 70 at % or less based on the total amount of the target.

1-1-1. FePt Alloy

The FePt alloy can have an fct structure with high magnetocrystalline anisotropy when subjected to heat treatment at high temperature (e.g., 600° C. or higher). Therefore, the FePt alloy has a role in serving as a recording layer of a magnetic recording medium and is a main component of the FePt—C-based sputtering target according to the embodiments of the present invention.

The reason that the content of Pt in the FePt alloy phase is defined to be 40 at % or more and 60 at % or less is that, when the content of Pt in the FePt alloy phase is outside the range of 40 at % or more and 60 at % or less, the fct (ordered face centered tetragonal) structure may not appear. The content of Pt in the FePt alloy phase is preferably 45 at % or more and 55 at % or less, more preferably 49 at % or more and 51 at % or less, and particularly preferably 50 at %, from the viewpoint that the fct (ordered face centered tetragonal) structure appears reliably in the FePt alloy phase.

1-1-2. C (Carbon)

C (carbon) has a role in serving as partitions separating FePt alloy particles, which are magnetic particles, from each other in an FePtC layer to be obtained by sputtering so as to reduce and uniformize the size of the FePt alloy particles in the FePtC layer and is one of the main components of the FePt—C-based sputtering target according to the first embodiment.

The reason that the content of C is set to be 21 at % or more and 70 at % or less based on the total amount of the target is that C can form the partitions separating the FePt alloy particles, which are magnetic particles, from each other in the FePtC layer to be obtained by sputtering so that the effect of reducing and uniformizing the size of the FePt alloy particles is achieved. If the content of C is less than 21 at %, this effect may not be sufficiently achieved. If the content of C exceeds 70 at %, the number of FePt alloy particles per unit volume of the FePtC layer to be obtained by sputtering becomes small in the FePtC layer, and this is disadvantageous for storage capacity. The content of C is preferably 30 at % or more and 65 at % or less based on the total amount of the target and more preferably 38 at % or more and 62 at % or less, from the viewpoint of achieving the effect of reducing and uniformizing the size of the FePt particles in the FePtC layer and from the viewpoint of the storage capacity of the FePtC layer to be formed.

1-1-3. Structure of Target

In the structure of the FePt—C-based sputtering target according to the first embodiment of the present invention, the FePt alloy phase containing Pt in an amount of 40 at % or more and 60 at % or less with the balance being Fe and unavoidable impurities and the C (carbon) phase containing unavoidable impurities are mutually dispersed.

The reason that the FePt—C-based sputtering target according to the first embodiment has the structure in which the FePt alloy phase and the C phase are mutually dispersed is to prevent certain regions from being sputtered at an excessive high rate during sputtering to improve the sputtering.

It is preferable to reduce the size of the C phase in the target as much as possible, in order to reduce the difference in sputtering rate at different positions. Therefore, the average size of the C phase in the target is preferably 0.6 μm or less as determined by the intercept method, more preferably 0.53 μm or less, and particularly preferably 0.45 μm or less.

With the present size reduction technique, it is necessary to increase the mixing time of the FePt alloy powder and the C powder, in order to reduce the average size of the C phase in the target. Therefore, it is not realistic to reduce the average size to a large extent with the present size reduction technique. When the average size of the C phase in the target is small to a certain extent, the problem with the difference in sputtering rate at different positions does not particularly occur. Therefore, a lower limit may be set on the average size of the C phase in the target. When the lower limit is set, the average size of the C phase in the target, i.e., the average phase size determined by the intercept method, is preferably 0.2 μm or more and 0.6 μm or less, more preferably 0.25 μm or more and 0.53 μm or less, and particularly preferably 0.33 μm or more and 0.45 μm or less, also in consideration of the cost with the present size reduction technique.

In the present description, the average size of the C phase is determined by the intercept method in the following manner.

First, a total of five lines are drawn on an SEM photograph of a cross section of a target (an image taken at a magnification of 10,000×). More specifically, two horizontal lines are drawn on the cross-section of the target in a left-right direction such that the image is divided vertically into thirds, and three vertical lines are drawn in a vertical direction such that the image is divided horizontally into quarters.

For each of the five lines, the total length of line segments intersecting the C phase and the number of the C phase intersected by the line are determined. Then the average of the lengths of the segments of the five lines that intersect the C phase is determined (by dividing the total length of the line segments intersecting the C phase by the number of the C phases intersected by the lines), and the obtained value is used as the average size of the C phase determined by the intercept method.

In order to perform sputtering favorably, it is preferable that the relative density of the target be large because the larger the value of the relative density, the smaller the volume of voids in the target. More specifically, the relative density of the target is preferably 90% or higher. To increase the relative density of the target, it is preferable to mix the FePt alloy powder and the C powder sufficiently to reduce the particle size of the C powder, as described later. The size of the C phase in the target is thereby reduced, and the voids in the target can be filled by the plastic flow of the FePt alloy during sintering, so that the relative density increases.

The content of oxygen is preferably 100 mass ppm or less based on the total mass of the target, and the content of nitrogen is preferably 30 mass ppm or less based on the total mass of the target. When the content of oxygen and the content of nitrogen in the target are small as described above, the content of oxygen and the content of nitrogen in the FePtC layer to be obtained by sputtering are also small, so that the FePtC layer obtained is favorable.

1-2. Production Process

The FePt—C-based sputtering target according to the first embodiment can be produced by: adding C powder containing unavoidable impurities to FePt alloy powder containing Pt in an amount of 40 at % or more and 60 at % or less with the balance being Fe and unavoidable impurities; mixing the C powder and the FePt alloy powder in an atmosphere containing oxygen to produce a powder mixture; and then molding the produced powder mixture while the powder mixture is heated under pressure.

In this production process, since the FePt alloy powder and the C powder are mixed in the atmosphere containing oxygen to produce the powder mixture, oxygen is adsorbed on newly formed fresh C surfaces to some extent during mixing. Therefore, when a mixing container is open to the air during or after mixing, oxygen is unlikely to be exponentially adsorbed on the surfaces of the C particles, so that ignition of the C powder is suppressed. Therefore, the FePt—C-based sputtering target can be produced stably.

In this production process, Fe and Pt are supplied in the form of FePt alloy powder and are not supplied as a single powder of Fe and a single powder of Pt. A single powder of Fe has high activity and may ignite in the air. However, when Fe and Pt are alloyed to form FePt alloy powder, the activity of Fe can be reduced although it is in the form of powder. Thus, with this production process, ignition of Fe during mixing with the C powder and ignition of Fe when the mixing container is open to the air after completion of mixing can be suppressed.

1-2-1. Production of FePt Alloy Powder

No particular limitation is imposed on the process for producing the FePt alloy powder. However, in this embodiment, an atomizing method is performed using a molten FePt alloy containing Pt in an amount of 40 at % or more and 60 at % or less with the balance being Fe and unavoidable impurities to produce FePt alloy powder having the same composition as that of the molten FePt alloy.

When the FePt alloy powder contains Pt in an amount of 40 at % or more and 60 at % or less, the FePt alloy phase in the target obtained by sintering of the FePt alloy powder also contains Pt in an amount of 40 at % or more and 60 at % or less, so that the fct structure is more likely to appear in an FePt phase in an FePtC layer obtained by sputtering using the above target.

Preferably, the FePt alloy powder is produced by an atomizing method. This is because of the following reason. In an atomizing method, raw metals (Fe and Pt) are first heated to high temperature to form molten metals. In this stage, alkali metals such as Na and K, alkaline-earth metals such as Ca, and gaseous impurities such as oxygen and nitrogen are volatilized and removed to the outside, so that the amount of impurities in the FePt alloy powder can be reduced. When a gas atomizing method is used, the amount of impurities in the FePt alloy powder can be further reduced by performing atomizing using argon gas or nitrogen gas.

The target obtained using the FePt alloy powder obtained by an atomizing method contains a reduced amount of impurities, so that the content of oxygen in the target can be suppressed to 100 mass ppm or less. In addition, the content of nitrogen can be suppressed to 30 mass ppm or less.

Therefore, sputtering performed using the target is favorable, and an FePtC film to be obtained is also favorable.

Examples of an applicable atomizing method include, for example, a gas atomizing method and a centrifugal atomizing method.

1-2-2. Mixing

The powder mixture is produced by mixing C powder having an average particle diameter of, for example, 20 nm or more and 100 nm or less with the FePt alloy powder obtained by an atomizing method described above so that the content of C is 21 at % or more and 70 at % or less based on the total amount of the powder mixture.

When the FePt alloy powder and the C powder are mixed, the particle diameter of the C powder decreases as the mixing of the FePt alloy powder and the C powder proceeds, and fresh C surfaces newly appear. However, by performing the mixing in an atmosphere containing oxygen, the oxygen is adsorbed also on the newly appearing fresh C surfaces. Therefore, at least a certain amount of oxygen has already been adsorbed on the surfaces of the C particles at the point of time of completion of mixing. Even when the mixing container is opened to introduce the air, the amount of oxygen adsorbed on the surfaces of the C particles does not increase exponentially, and ignition of the C particles by heat of adsorption is unlikely to occur. As described in a Comparative Example later, when the FePt alloy powder and the C powder are mixed in an atmosphere containing no oxygen, no oxygen is adsorbed on newly appearing fresh C surfaces. Therefore, when the mixing container is open to the air after completion of mixing, a large amount of oxygen is immediately adsorbed on the surfaces of the C particles, and heat of adsorption is exponentially generated. This increases the possibility of ignition of the C particles.

From the viewpoint of allowing a sufficient amount of oxygen to be adsorbed on the surfaces of the C particles at the point of time of completion of mixing, it is preferable that oxygen be continuously supplied from the outside of the mixing container to the atmosphere used during mixing. By supplying oxygen continuously, a shortage of oxygen in the atmosphere is unlikely to occur, so that a sufficient amount of oxygen is easily adsorbed on the surfaces of the C particles during mixing.

However, if the amount of oxygen in the atmosphere during mixing of the FePt alloy powder and the C powder is too large, the C powder may ignite during mixing.

From the viewpoint of allowing a sufficient amount of oxygen to be adsorbed on the surfaces of the C particles at the point of time of completion of mixing and from the viewpoint that the C particles may ignite during mixing if the amount of oxygen in the atmosphere is too large, the concentration of oxygen in the atmosphere during mixing is preferably 10 vol % or higher and 30 vol % or lower, more preferably 15 vol % or higher and 25 vol % or lower, and particularly preferably 19 vol % or higher and 22 vol % or lower.

Oxygen may be supplied to the atmosphere during mixing by supplying air. This can reduce cost.

The atmosphere during mixing may be composed substantially of an inert gas and oxygen. In this case, incorporation of impurities from the atmosphere into the mixture particles can be suppressed. For example, argon, nitrogen, etc. may be used as the inert gas.

The atmosphere during mixing may be released to the air at some point in the mixing step. Even when the atmosphere is short of oxygen at some point in the mixing step, oxygen can be introduced from the air by releasing the atmosphere into the air, so that the shortage of oxygen can be mitigated.

1-2-3. Molding Method

No particular limitation is imposed on the method for molding the powder mixture produced as described above while the powder mixture is heated under pressure. For example, a hot pressing method, a hot isostatic pressing method (HIP method), a spark plasma sintering method (SPS method), etc. may be used. Preferably, when implementing the present invention, such a molding method is performed in a vacuum or an inert gas atmosphere. In this case, even when the powder mixture contains a certain amount of oxygen, the amount of oxygen in the sintered product obtained is reduced.

1-3. Effects

Patent Literature 2 (Japanese Patent Application Laid-Open No. 2006-161082) discloses a process for producing a sputtering target formed of a PtFe-based alloy by casting. However, it is difficult to increase the content of C (carbon) by using casting, because of the solubility limit of C in the alloy, separation due to the difference in specific gravity between C and the alloy, etc. In claims 2 and 3 and paragraph 0017 in Patent Literature 2 (Japanese Patent Application Laid-Open No. 2006-161082), C is a choice among a plurality of choices for the element added to the PtFe-based alloy, but the content of the element is 20 at % at the maximum.

However, the production process in the first embodiment uses a sintering method, and therefore the content of C based on the total amount of the target can be increased. More specifically, an FePt—C-based sputtering target containing a large amount, e.g., 21 at % or more and 70 at % or less, of C can be produced. Therefore, when sputtering is performed using the FePt—C-based sputtering target according to the first embodiment, the content of carbon in an FePtC thin film obtained can be increased.

In the production process in the first embodiment, the FePt alloy powder and the C powder are mixed in an atmosphere containing oxygen. Therefore, at least a certain amount of oxygen has already been adsorbed on the surfaces of the C particles at the point of time of completion of mixing. Thus, even when the mixing container is opened after completion of mixing to introduce the air, oxygen is unlikely to be exponentially adsorbed on the C particles, so that ignition of the C particles is suppressed. Accordingly, although the content of C is large, i.e., 21 at % or more and 70 at % or less based on the total amount of the target, the FePt—C-based sputtering target can be stably produced.

In the production process in the first embodiment, Fe and Pt are alloyed to form an FePt alloy powder. In this manner, the activity of Fe can be reduced although it is in the form of powder, and ignition of Fe during mixing with the C powder can be suppressed.

2. Second Embodiment 2-1. Components and Structure of Sputtering Target

The FePt—C-based sputtering target according to the first embodiment contains Fe and Pt as the alloy components. However, an FePt—C-based sputtering target according to a second embodiment of the present invention further contains, as an alloy component, a metal element other than Fe and Pt, i.e., Cu. This is the difference from the FePt—C-based sputtering target according to the first embodiment. Namely, the FePt—C-based sputtering target according to the second embodiment of the present invention contains Fe, Pt, and C and further contains Cu, which is a metal element other than Fe and Pt. The FePt—C-based sputtering target is characterized in that it has a structure in which an FePt-based alloy phase and a C phase containing unavoidable impurities are mutually dispersed, the FePt-based alloy phase containing Pt in an amount of 40 at % or more and less than 60 at % and Cu in an amount of more than 0 at % and 20 at % or less with the balance being Fe and unavoidable impurities and with the total amount of Pt and Cu being 60 at % or less, and that the content of C is 21 at % or more and 70 at % or less based on the total amount of the target.

2-1-1. FePtCu Alloy

In the FePt—C-based sputtering target according to the second embodiment of the present invention, Cu is added to an FePt alloy to form an FePtCu alloy. When Cu is contained, the temperature of the heat treatment for converting the crystal structure of the FePt-based alloy to the fct structure can be reduced (to, for example, 600° C.), so that the cost of the heat treatment on an FePtC layer obtained by sputtering can be reduced. In addition, the addition of Cu may allow the crystal structure of the obtained FePtC layer to be converted to the fct structure by heat generated during sputtering without additional heat treatment.

The reason that the content of Pt in the FePtCu alloy phase in the second embodiment is defined to be 40 at % or more and less than 60 at % is that, when the content of Pt in the FePtCu alloy phase is outside the range of 40 at % or more and less than 60 at %, the fct (ordered face centered tetragonal) structure may not appear. The content of Pt in the FePtCu alloy phase is preferably 45 at % or more and 55 at % or less and more preferably 49 at % or more and 51 at % or less, from the viewpoint that the fct (ordered face centered tetragonal) structure appears reliably in the FePtCu alloy phase. However, it is premised that the total content of Fe and Pt is less than 100 at %, that the content of Cu is more than 0 at % and 20 at % or less, and that the total content of Pt and Cu is 60 at % or less.

A metal other than Cu can be added to the FePt alloy, and examples thereof include Ag, Mn, Ni, Co, Pd, Cr, V, and B.

2-1-2. C (Carbon)

The role of C (carbon) is the same as that described above in the first embodiment. More specifically, C (carbon) has a role in serving as partitions separating FePtCu alloy particles, which are magnetic particles, from each other in an FePtCuC layer to be obtained by sputtering to reduce and uniformize the size of the FePtCu particles in the FePtCuC layer and is one of the main components of the FePt—C-based sputtering target according to the second embodiment.

The reason that the content of C is set to be 21 at % or more and 70 at % or less based on the total amount of the target is the same as that described above in the first embodiment. More specifically, the reason is that C can form the partitions separating the FePtCu alloy particles, which are magnetic particles, from each other in the FePtCuC layer to be obtained by sputtering so that the effect of reducing and uniformizing the size of the FePtCu alloy particles is achieved. If the content of C is less than 21 at %, this effect may not be sufficiently achieved. If the content of C exceeds 70 at %, the number of FePtCu alloy particles per unit volume of the FePtCuC layer to be obtained by sputtering becomes small in the FePtCuC layer, and this is disadvantageous for storage capacity. The content of C is preferably 30 at % or more and 65 at % or less based on the total amount of the target and more preferably 38 at % or more and 62 at % or less, from the viewpoint of achieving the effect of reducing and uniformizing the size of the FePtCu particles in the FePtCuC layer and from the viewpoint of the storage capacity of the FePtCuC layer to be formed.

2-1-3. Structure of Target

In the structure of the FePt—C-based sputtering target according to the second embodiment of the present invention, the FePt-based alloy phase and the C phase containing unavoidable impurities are mutually dispersed. The FePt-based alloy phase contains Pt in an amount of 40 at % or more and less than 60 at % and Cu in an amount of more than 0 at % and 20 at % or less with the balance being Fe and unavoidable impurities and with the total amount of Pt and Cu being 60 at % or less. The content of C is 21 at % or more 70 at % or less based on the total amount of the target.

The reason that the FePt—C-based sputtering target according to the second embodiment has the structure in which the FePtCu alloy phase and the C phase are mutually dispersed is the same as that described above in the first embodiment. More specifically, the reason is to prevent certain regions from being sputtered at an excessive high rate during sputtering to improve the sputtering.

The size of the C phase in the target, i.e., the average size of the phase determined by the intercept method, is preferably 0.6 μm or less, more preferably 0.53 μm or less, and particularly preferably 0.45 μm or less, for the same reason as that for the FePt—C-based sputtering target according to the first embodiment. As in the FePt—C-based sputtering target according to the first embodiment, a lower limit may be set on the size of the C phase in the target. When the lower limit is set, the average size of the C phase in the target, i.e., the average phase size determined by the intercept method, is preferably 0.2 μm or more and 0.6 μm or less, more preferably 0.25 μm or more and 0.53 μm or less, and particularly preferably 0.33 μm or more and 0.45 μm or less, also in consideration of the cost with the present size reduction technique.

As in the FePt—C-based sputtering target according to the first embodiment, in order to perform sputtering favorably, it is preferable that the relative density of the target be large because the larger the value of the relative density, the smaller the volume of voids in the target. More specifically, the relative density of the target is preferably 90% or higher. To increase the relative density of the target, it is preferable to mix the FePtCu alloy powder and the C powder sufficiently to reduce the particle size of the C powder, as described later. The size of the C phase in the target is thereby reduced, and the voids in the target can be filled by the plastic flow of the FePtCu alloy during sintering, so that the relative density increases.

As in the FePt—C-based sputtering target according to the first embodiment, the content of oxygen is preferably 100 mass ppm or less based on the total mass of the target, and the content of nitrogen is preferably 30 mass ppm or less based on the total mass of the target. When the content of oxygen and the content of nitrogen in the target are small as described above, the content of oxygen and the content of nitrogen in the FePtCuC layer to be obtained by sputtering are also small, so that the FePtCuC layer obtained is favorable.

2-2. Production Process

The FePt—C-based sputtering target according to the second embodiment can be produced by: adding C powder containing unavoidable impurities to FePtCu alloy powder containing Pt in an amount of 40 at % or more and less than 60 at % and Cu in an amount of more than 0 at % and 20 at % or less with the balance being Fe and unavoidable impurities and with the total amount of Pt and Cu being 60 at % or less; mixing the C powder and the FePtCu alloy powder in an atmosphere containing oxygen to produce a powder mixture; and molding the produced powder mixture while the mixture is heated under pressure.

In this production process, since the FePtCu alloy powder and the C powder are mixed in the atmosphere containing oxygen to produce the powder mixture, oxygen is adsorbed on newly formed fresh C surfaces to some extent during mixing. Therefore, when a mixing container is open to the air during or after mixing, oxygen is unlikely to be exponentially adsorbed on the surfaces of the C particles, so that ignition of the C powder is suppressed. Therefore, the FePt—C-based sputtering target can be produced stably.

In this production process, as in the process for producing the target in the first embodiment, Fe is not supplied as a single powder. Fe, Pt, and Cu are supplied as the FePtCu alloy powder and are not supplied as a single powder of Fe, a single powder of Pt, and a single powder of Cu. A single powder of Fe has high activity and may be ignite in the air. However, when Fe, Pt, and Cu are alloyed to form an FePtCu alloy powder, the activity of Fe can be reduced although it is in the form of powder. Therefore, with this production process, as with the process for producing the target in the first embodiment, ignition of Fe during mixing with the C powder and ignition of Fe when the mixing container is open to the air after completion of mixing can be suppressed.

2-2-1. Production of FePtCu Alloy Powder

No particular limitation is imposed on the process for producing the FePtCu alloy powder. However, in this production process, an atomizing method is performed using a molten FePtCu alloy containing Pt in an amount of 40 at % or more and less than 60 at % and Cu in an amount of more than 0 at % and 20 at % or less with the balance being Fe and unavoidable impurities and with the total amount of Pt and the one or more kinds of metal elements being 60 at % or less to produce FePtCu alloy powder having the same composition as that of the molten FePtCu alloy.

When the FePtCu alloy powder contains Pt in an amount of 40 at % or more and less than 60 at % and Cu in an amount of more than 0 at % and 20 at % or less (provided that the total amount of Pt and Cu is 60 at % or less), the FePtCu alloy phase in the target obtained by sintering the FePtCu alloy powder also contains Pt in an amount of 40 at % or more and less than 60 at % and Fe in an amount of 40 at % or more and less than 60 at %. Therefore, the fct structure is more likely to appear in an FePtCu phase in the FePtCuC layer obtained by sputtering using the target.

As in the process for producing the target in the first embodiment, the FePtCu alloy powder is preferably produced by an atomizing method. This is because of the following reason. In an atomizing method, raw metals (Fe, Pt, and Cu) are first heated to high temperature to form molten metals. In this stage, alkali metals such as Na and K, alkaline-earth metals such as Ca, and gaseous impurities such as oxygen and nitrogen are volatilized and removed to the outside, so that the amount of impurities in the FePtCu alloy powder can be reduced. When a gas atomizing method is used, the amount of impurities in the FePtCu alloy powder can be further reduced by performing atomizing using argon gas or nitrogen gas.

The target obtained using the FePtCu alloy powder obtained by an atomizing method contains a reduced amount of impurities, so that the content of oxygen in the target can be suppressed to 100 mass ppm or less. In addition, the content of nitrogen can be suppressed to 30 mass ppm or less.

Therefore, sputtering performed using the target is favorable, and an FePtCuC film to be obtained is also favorable.

Examples of an applicable atomizing method include, for example, a gas atomizing method and a centrifugal atomizing method.

2-2-2. Mixing

In this production process, as in the process for producing the target in the first embodiment, the powder mixture is produced by mixing C powder having an average particle diameter of, for example, 20 nm or more and 100 nm or less with the FePt alloy powder obtained by an atomizing method described above such that the content of C is 21 at % or more and 70 at % or less based on the total amount of the powder mixture.

When the FePtCu alloy powder and the C powder are mixed, the particle diameter of the C powder decreases as the mixing of the FePtCu alloy powder and the C powder proceeds, and fresh C surfaces newly appear. However, by performing the mixing in an atmosphere containing oxygen, as with the process for producing the target in the first embodiment, the oxygen is adsorbed also on the newly appearing fresh C surfaces. Therefore, at least a certain amount of oxygen has already been adsorbed on the surfaces of the C particles at the point of time of completion of mixing. Even when the mixing container is opened to introduce the air, the amount of oxygen adsorbed on the surfaces of the C particles does not increase exponentially, and ignition of the C particles by heat of adsorption is unlikely to occur.

From the viewpoint of allowing a sufficient amount of oxygen to be adsorbed on the surfaces of the C particles at the point of time of completion of mixing, in this production process, as in the process for producing the target in the first embodiment, it is preferable that oxygen be continuously supplied from the outside of the mixing container to the atmosphere used during mixing. By supplying oxygen continuously, a shortage of oxygen in the atmosphere is unlikely to occur, so that a sufficient amount of oxygen is easily adsorbed on the surfaces of the C particles during mixing.

However, if the amount of oxygen in the atmosphere during mixing of the FePtCu alloy powder and the C powder is too large, the C powder may ignite during mixing.

From the viewpoint of allowing a sufficient amount of oxygen to be adsorbed on the surfaces of the C particles at the point of time of completion of mixing and from the viewpoint that the C particles may ignite during mixing if the amount of oxygen in the atmosphere is too large, in this production process, as in the process for producing the target in the first embodiment, the concentration of oxygen in the atmosphere during mixing is preferably 10 vol % or higher and 30 vol % or lower, more preferably 15 vol % or higher and 25 vol % or lower, and particularly preferably 19 vol % or higher and 22 vol % or lower.

Oxygen may be supplied to the atmosphere during mixing by supplying air. This can reduce cost.

The atmosphere during mixing may be composed substantially of an inert gas and oxygen. In this case, incorporation of impurities from the atmosphere into the mixture particles can be suppressed. For example, argon, nitrogen, etc. may be used as the inert gas.

The atmosphere during mixing may be released to the air at some point in the mixing step. Even when the atmosphere is short of oxygen at some point in the mixing step, oxygen can be introduced from the air by releasing the atmosphere into the air, so that the shortage of oxygen can be mitigated.

2-2-3. Molding Method

In this production process, no particular limitation is imposed on the method for molding the powder mixture produced as described above while the powder mixture is heated under pressure. In this production process, as in the process for producing the target in the first embodiment, for example, a hot pressing method, a hot isostatic pressing method (HIP method), a spark plasma sintering method (SPS method), etc. may be used. Preferably, when implementing the present invention, such a molding method is performed in a vacuum or an inert gas atmosphere. In this case, even when the powder mixture contains a certain amount of oxygen, the amount of oxygen in the sintered product obtained is reduced.

The production process in the second embodiment, as the production process in the first embodiment, uses a sintering method, and therefore the content of C based on the total amount of the target can be increased. More specifically, an FePt—C-based sputtering target containing a large amount, e.g., 21 at % or more and 70 at % or less, of C can be produced. Therefore, when sputtering is performed using the FePt—C-based sputtering target according to the second embodiment, the content of carbon in an FePtC thin film obtained can be increased.

In the production process in the second embodiment, the FePtCu alloy powder and the C powder are mixed in an atmosphere containing oxygen. Therefore, at least a certain amount of oxygen has already been adsorbed on the surfaces of the C particles at the point of time of completion of mixing. Thus, even when the mixing container is opened after completion of mixing to introduce the air, oxygen is unlikely to be exponentially adsorbed on the C particles, so that ignition of the C particles is suppressed. Accordingly, although the content of C is large, i.e., 21 at % or more and 70 at % or less based on the total amount of the target, the FePt—C-based sputtering target can be stably produced.

In the production process in the second embodiment, Fe, Pt, and Cu are alloyed to form an FePtCu alloy powder. In this manner, the activity of Fe can be reduced although it is in the form of powder, and ignition of Fe during mixing with the C powder can be suppressed.

EXAMPLES

Example 1

The target compositions of a powder mixture and a target in Example 1 are 40(50Fe-50Pt)-60C. More specifically, the target composition of the metal components is 50 at % Fe-50 at % Pt, and the target compositional ratios of the FePt alloy and C (carbon) are 40 at % for the FePt alloy and 60 at % for C. However, as described later, since part of C (carbon) is volatilized during production of the powder mixture and during sintering of the target, the compositional ratios of the FePt alloy and C (carbon) in the powder mixture and target obtained slightly deviate from the target values. When the content of C (carbon) is represented not by at % but by vol %, the target compositions of the powder mixture and target in Example 1 are (50Fe-50Pt)-49.6 vol % C.

The metals in bulk form were weighed such that the composition of the alloy was Fe: 50 at % and Pt: 50 at % and then heated by high frequency heating to form a molten Fe—Pt alloy at 1,800° C. Then a gas atomizing method using argon gas was performed to produce 50 at % Fe-50 at % Pt alloy powder. The average particle diameter of the obtained alloy powder was measured using Microtrac MT3000 manufactured by NIKKISO Co., Ltd. and found to be 50 μm.

89.03 g of C powder having an average particle diameter of 35 μm and a bulk density of 0.25 $g/cm^3$ was added to 620.00 g of the obtained Fe—Pt alloy powder such that the content of C was 60 at % based on the total amount of the powder, and then these components were mixed using a ball mill until the cumulative number of revolutions reached 4,136,400 to thereby produce a powder mixture. Hereinafter, the cumulative number of revolutions of the ball mill may be referred to as the cumulative number of ball mill revolutions or simply as the number of revolutions.

A mixing container was covered with a lid during mixing. However, an introduction port for introducing outside air and a discharge port for discharging were provided in the mixing container, and fresh air was always circulated in the mixing container, so that the amount of oxygen in the mixing container was always the same as that in the air.

When the cumulative number of ball mill revolutions reached 935,280, 2,535,840, and 4,136,400, the lid of the mixing container was opened, and the powder mixture was taken out. Then the contents of oxygen and nitrogen in the powder mixture were measured using a TC-600 Series Nitrogen/Oxygen Determinator manufactured by LECO Corporation, and the content of carbon was measured using a Carbon/Sulfur Analyzer manufactured by HORIBA, Ltd. In addition, whether or not ignition had occurred was visually checked when the lid of the mixing container was opened. These results are shown in TABLE 1 below.

TABLE 1

| Cumulative number of ball mill revolutions (Number) | Oxygen (mass %) | Nitrogen (mass ppm) | Carbon (mass %) | Ignition |
| --- | --- | --- | --- | --- |
| 0 | 0.2 | 130 | 12.55 | No |
| 935,280 | 1.37 | 1,300 | 12.33 | No |
| 2,535,840 | 1.85 | 1,293 | 12.12 | No |
| 4,136,400 | 2.30 | 1,293 | 11.78 | No |

When the cumulative number of ball mill revolutions reached 935,280, 2,535,840, and 4,136,400, the mixing container was opened, and whether or not ignition had occurred was visually checked. However, no ignition was found at each point.

As the cumulative number of ball mill revolutions increases, the content of oxygen in the powder mixture increases, but the content of carbon decreases. This may be because, as the mixing proceeds, the adsorption of oxygen to the C powder proceeds, but part of carbon reacts with oxygen and volatilizes as CO and $CO_2$. The content of nitrogen in the powder mixture was substantially constant after the cumulative number of ball mill revolutions reached 935,280.

The powder mixture mixed until the cumulative number of ball mill revolutions reached 4,136,400 was subjected to hot pressing under the conditions of temperature: 1,460° C., pressure: 25 MPa, time: 45 min., atmosphere: a vacuum of $5\times10^{-2}$ Pa or lower to thereby produce a sintered product.

The density of the produced sintered product was measured by the Archimedes method, and the measured value was divided by a theoretical density to determine the relative density. The results are shown in TABLE 2 below. The content of carbon in the sintered product actually measured (see TABLE 3) was used as the amount of carbon used to compute the theoretical density, that is to say, the theoretical density was computed in consideration of a reduction in the amount of carbon during mixing and sintering.

TABLE 2

| Measured density ($g/cm^3$) | Theoretical density ($g/m^3$) | Relative density (%) |
| --- | --- | --- |
| 8.91 | 9.24 | 96.4 |

The relative density was high, i.e., 96.4%, so that the amount of voids in the obtained sintered product was small.

The contents of oxygen and nitrogen in the sintered product were measured using a TC-600 Series Nitrogen/Oxygen Determinator manufactured by LECO Corporation, and the content of carbon was measured using a Carbon/Sulfur Analyzer manufactured by HORIBA, Ltd. The measurement results are shown in TABLE 3 below. In the below TABLE 3, the measurement results for the non-sintered powder mixture (the cumulative number of ball mill revolutions: 4,136,400) are also shown for comparison.

TABLE 3

| | Oxygen (mass %) | Nitrogen (mass ppm) | Carbon (mass %) |
| --- | --- | --- | --- |
| Powder mixture before sintering | 2.30 | 1293 | 11.78 |
| Sintered product (Sintering temperature: 1,460° C.) | 0.0045 | 2 | 11.56 |

The content of oxygen in the powder mixture mixed until the cumulative number of ball mill revolutions reached 4,136,400 was 2.30 mass %. However, the content of oxygen in the sintered product obtained by hot pressing of the powder mixture in a vacuum was 0.0045 mass % (45 mass ppm), i.e., was reduced to about 1/511, and a significant reduction was found. Therefore, it was found that, even when mixing was performed in an atmosphere containing oxygen and a large amount of oxygen was adsorbed on the C powder during mixing, the adsorbed oxygen was volatilized during sintering, and almost no oxygen was introduced into the sintered product.

The content of nitrogen in the sintered product obtained by hot pressing was reduced to about 1/647, and a significant reduction was found.

The content of carbon was slightly reduced by hot pressing. This may be because carbon reacts with oxygen adsorbed on the surface during hot pressing and volatilizes as CO and $CO_2$.

Figure 2:
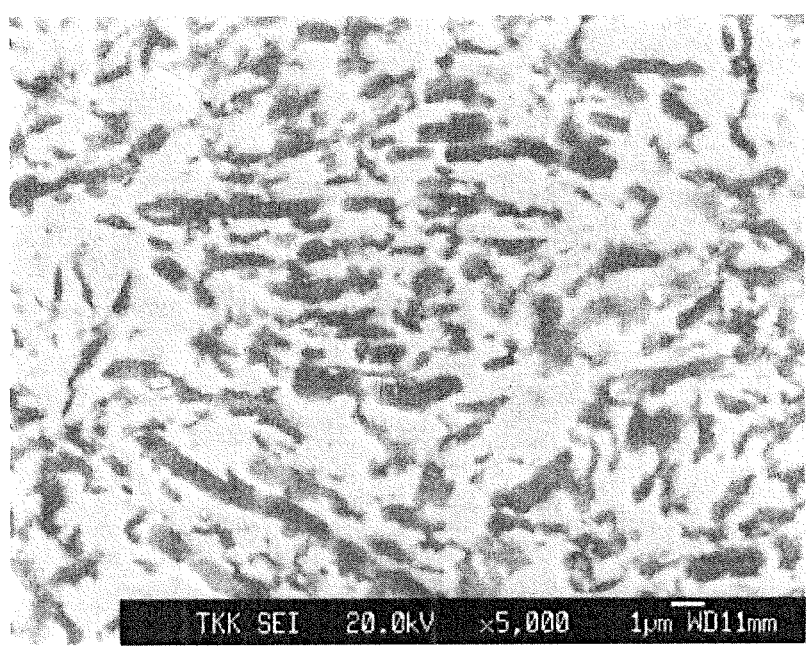
FIG. 2 is a medium-magnification scanning electron micrograph (an image taken at a magnification of 5,000×) of the structure of a sintered product in Example 1 (the cumulative number of ball mill revolutions: 4,136,400, sintering temperature: 1,460° C.) (a bar scale in the photograph: 1 µm).
Figure 3:
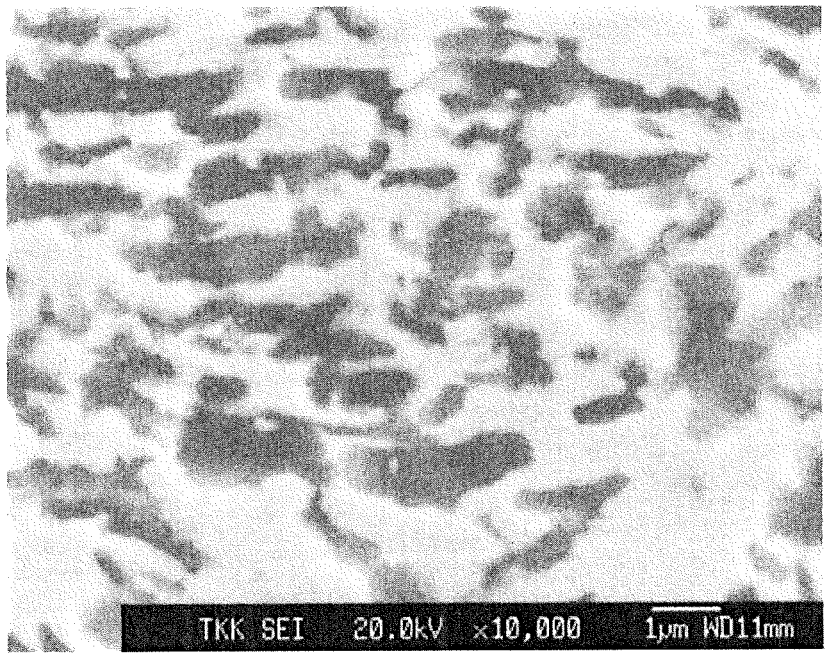
FIG. 3 is a high-magnification scanning electron micrograph (an image taken at a magnification of 10,000×) of the structure of a sintered product in Example 1 (the cumulative number of ball mill revolutions: 4,136,400, sintering temperature: 1,460° C.) (a bar scale in the photograph: 1 µm).

The structure of the obtained sintered product (the cumulative number of ball mill revolutions: 4,136,400, sintering temperature: 1,460° C.) was observed under a scanning electron microscope (SEM). FIGS. 1, 2, and 3 show SEM photographs of the sintered product. FIG. 1 is an SEM photograph at a low magnification (an image taken at a magnification of 3,000×) (a bar scale in the photograph represents 1 μm). FIG. 2 is an SEM photograph at a medium magnification (an image taken at a magnification of 5,000×) (a bar scale in the photograph represents 1 μm), and FIG. 3 is an SEM photograph at a high magnification (an image taken at a magnification of 10,000×) (a bar scale in the photograph represents 1 μm). In FIGS. 1, 2, and 3, dark gray regions are the C phase, and white regions are the FePt alloy phase. As can be seen from FIGS. 1, 2, and 3, fine regions of the C phase are dispersed in the entire area of the structure.

Next, the size of the phase in the obtained sintered product (the cumulative number of ball mill revolutions: 4,136,400, sintering temperature: 1,460° C.) was determined by the intercept method.

Specifically, a total of five lines were drawn on the SEM photograph of the cross section of the target in FIG. 3 (an image taken at a magnification of 10,000×). More specifically, two horizontal lines were drawn on the SEM photograph of FIG. 3 in a left-right direction such that the image was divided vertically into thirds, and three vertical lines were drawn in a vertical direction such that the image was divided horizontally into quarters.

For each of the five lines, the total length of line segments intersecting the C phase and the number of the C phase intersected by the line were determined. Then the average of the lengths of the segments of the five lines that intersected the C phase was determined (by dividing the total length of the line segments intersecting the C phase by the number of the C phases intersected by the lines), and the obtained value was used as the average size of the C phase determined by the intercept method. The results showed that the average size of the C phase determined by the intercept method was 0.52 μm.

Example 2

A powder mixture and a sintered product were produced in the same manner as in Example 1 except that the mixing container was filled with air and sealed and the FePt powder and C powder were mixed in the sealed mixing container, that the cumulative number of ball mill revolutions was changed, that the number of times and the timing of introduction of fresh air by opening the mixing container during mixing were changed, and that the sintering temperature during production of the sintered product was changed to 1,380° C. and 1,340° C. The target compositions of the powder mixture and target in Example 2 are the same as those in Example 1 and each are 40(50Fe-50Pt)-60C.

When the cumulative number of ball mill revolutions reached 2,805,840, and 4,073,760, the lid of the mixing container was opened, and the powder mixture was taken out. Then the contents of oxygen and nitrogen in the powder mixture were measured using a TC-600 Series Nitrogen/Oxygen Determinator manufactured by LECO Corporation, and the content of carbon was measured using a Carbon/Sulfur Analyzer manufactured by HORIBA, Ltd. In addition, whether or not ignition had occurred was visually checked when the lid of the mixing container was opened. These results are shown in TABLE 4 below.

TABLE 4

| Cumulative number of ball mill revolutions (Number) | Oxygen (mass %) | Nitrogen (mass ppm) | Carbon (mass %) | Ignition |
|---|---|---|---|---|
| 0 | 0.2 | 130 | 12.55 | No |
| 2,805,840 | 2.28 | 3,200 | 12.31 | No |
| 4,073,760 | 1.98 | 2,870 | 12.08 | No |

When the cumulative number of ball mill revolutions reached 935,280, 1,870,560, 2,805,840, and 4,073,760, the mixing container was opened, and whether or not ignition had occurred was visually checked. However, no ignition was found at each point.

At the point of time when the cumulative number of ball mill revolutions was 2,805,840, the content of oxygen in the powder mixture increased 114 times as compared to that before mixing was started (the number of revolutions: 0), but the content of carbon decreased. This may be because, as the mixing proceeds, the adsorption of oxygen to the C powder proceeds, but part of carbon reacts with oxygen and volatilizes as CO and $CO_2$. At the point of time when the cumulative number of ball mill revolutions was 2,805,840, the content of nitrogen in the powder mixture also increased about 25 times as compared to that before mixing was started (the number of revolutions: 0).

Next, the powder mixture mixed until the cumulative number of ball mill revolutions reached 2,805,840 was subjected to hot pressing under the conditions of temperature: 1,380° C., pressure: 25 MPa, time: 45 min., atmosphere: a vacuum of $5 \times 10^{-2}$ Pa or lower to thereby produce a sintered product. In addition, the powder mixture mixed until the cumulative number of ball mill revolutions reached 4,073,760 was subjected to hot pressing under the conditions of temperature: 1,340° C., pressure: 25 MPa, time: 45 min., atmosphere: a vacuum of $5 \times 10^{-2}$ Pa or lower to thereby produce a sintered product.

The density of each of the produced sintered products was measured by the Archimedes method, and the measured value was divided by a theoretical density to determine the relative density. The results are shown in TABLE 5 below. The content of carbon in each sintered product shown in TABLE 6 was used as the amount of carbon used to compute the theoretical density, that is to say, the theoretical density was computed in consideration of a reduction in the amount of carbon during mixing and sintering.

TABLE 5

| Sintered powder mixture | Sintering temperature (° C.) | Density (g/cm³) | Theoretical density (g/cm³) | Relative density (%) |
|---|---|---|---|---|
| Powder mixture when number of revolution was 2,805,840 | 1,380 | 8.49 | 9.09 | 93.4 |
| Powder mixture when number of revolution was 4,073,760 | 1,340 | 8.41 | 9.14 | 92.0 |

The relative densities of the two sintered products were high, i.e., 93.4% and 92.0%, so that the amount of voids in each of the obtained sintered products was small.

The contents of oxygen and nitrogen in the sintered product were measured using a TC-600 Series Nitrogen/Oxygen Determinator manufactured by LECO Corporation, and the content of carbon was measured using a Carbon/Sulfur Analyzer manufactured by HORIBA, Ltd. The measurement results are shown in TABLE 3 below. In the below TABLE 6, the measurement results for the non-sintered powder mixture (the cumulative number of ball mill revolutions: 2,805,840, 4,073,760) are also shown for comparison.

TABLE 6

| | Oxygen (mass %) | Nitrogen (mass ppm) | Carbon (mass %) |
|---|---|---|---|
| Powder mixture (Cumulative number of ball mill revolutions: 2,805,840) | 2.28 | 3,200 | 12.31 |
| Sintered product (Sintering temperature: 1,380° C.) | 0.0048 | 17 | 12.04 |
| Powder mixture (Cumulative number of ball mill revolutions: 4,073,760) | 1.98 | 2,870 | 12.08 |
| Sintered product (Sintering temperature: 1,340° C.) | 0.0053 | 21 | 11.89 |

The content of oxygen in the powder mixture mixed until the cumulative number of ball mill revolutions reached 2,805,840 was 2.28 mass %. However, the content of oxygen in the sintered product obtained by hot pressing of the above powder mixture in a vacuum was 0.0048 mass % (48 mass ppm), i.e., was reduced to about 1/475. The content of oxygen in the powder mixture mixed until the total number of revolutions reached 4,073,760 was 1.98 mass %. However, the content of oxygen in the sintered product obtained by hot pressing of the above powder mixture in a vacuum was 0.0053 mass % (53 mass ppm), i.e., was reduced to about 1/374. Therefore, it was found that, even when mixing was performed in an atmosphere containing oxygen and a large amount of oxygen was adsorbed on the C powder during mixing, the adsorbed oxygen was volatilized during sintering, and only a little oxygen remained in the sintered product.

The contents of nitrogen in the sintered products were significantly smaller than those in the powder mixtures.

The contents of carbon were slightly reduced by sintering. This may be because carbon reacts with oxygen adsorbed on the surface during hot pressing and volatilizes as CO and $CO_2$.

Figure 4:
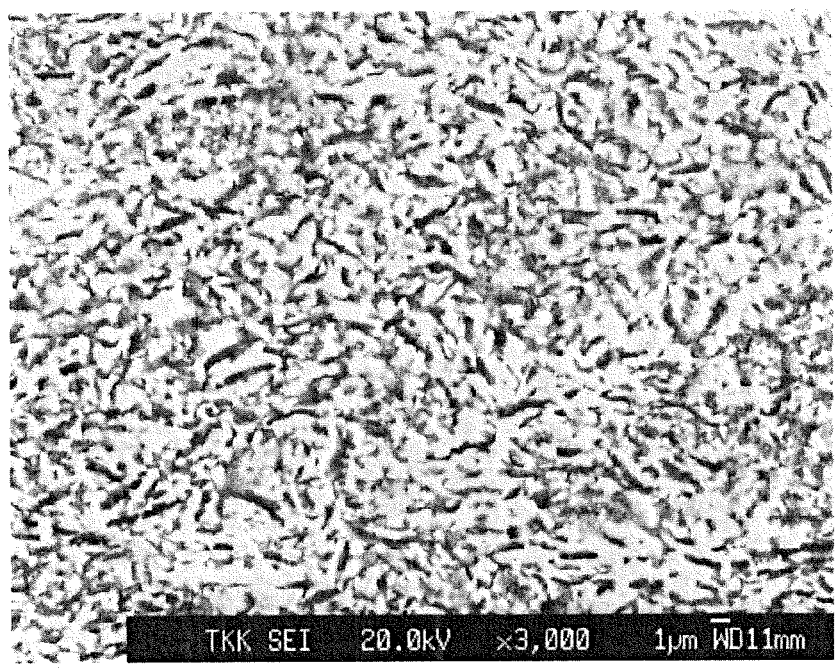
FIG. 4 is a low-magnification scanning electron micrograph (an image taken at a magnification of 3,000×) of the structure of a sintered product in Example 2 (the cumulative number of ball mill revolutions: 4,073,760, sintering temperature: 1,340° C.) (a bar scale in the photograph: 1 µm).
Figure 5:
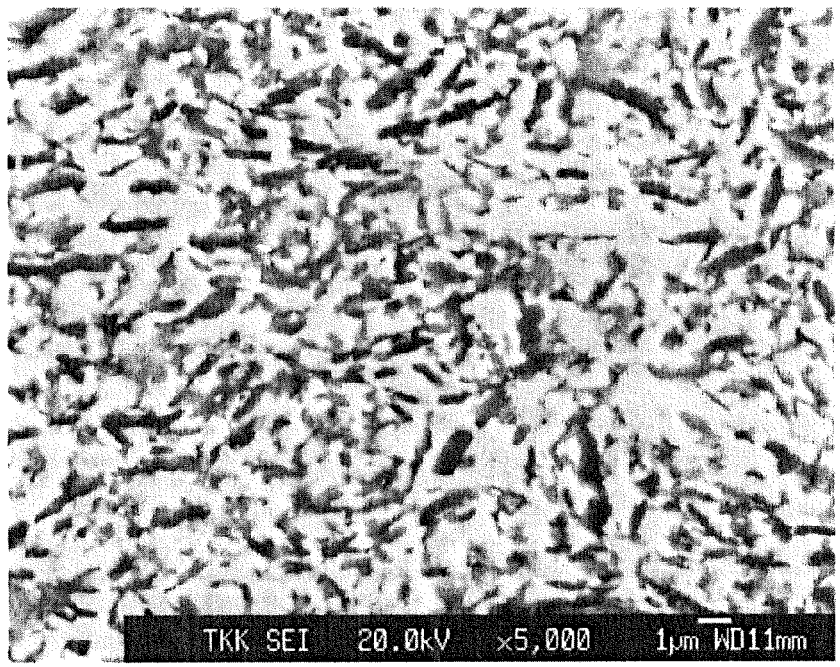
FIG. 5 is a medium-magnification scanning electron micrograph (an image taken at a magnification of 5,000×) of the structure of a sintered product in Example 2 (the cumulative number of ball mill revolutions: 4,073,760, sintering temperature: 1,340° C.) (a bar scale in the photograph: 1 µm).
Figure 6:
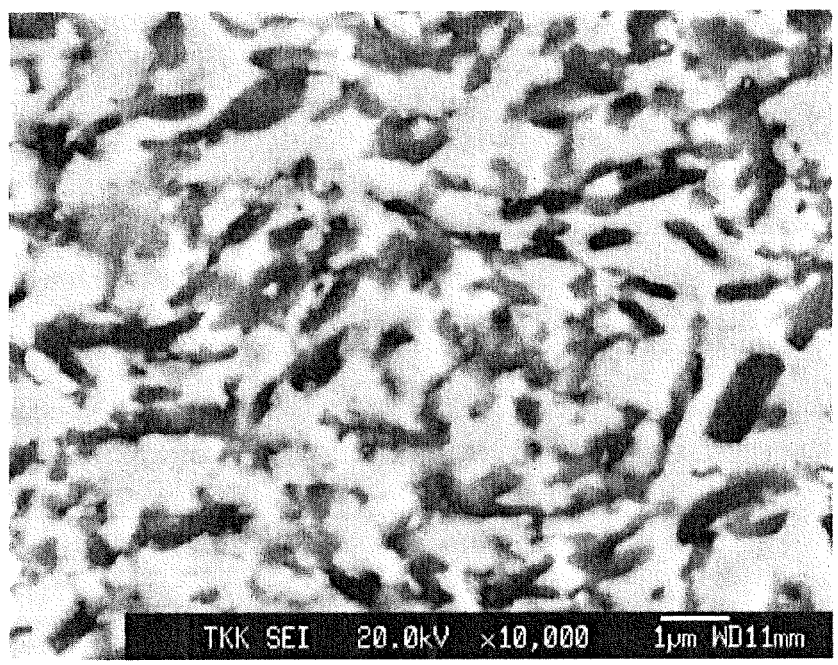
FIG. 6 is a high-magnification scanning electron micrograph (an image taken at a magnification of 10,000×) of the structure of a sintered product in Example 2 (the cumulative number of ball mill revolutions: 4,073,760, sintering temperature: 1,340° C.) (a bar scale in the photograph: 1 μm).

The structure of the obtained sintered product (the cumulative number of ball mill revolutions: 4,073,760, sintering temperature: 1,340° C.) was observed under a scanning electron microscope (SEM). FIGS. 4, 5, and 6 show SEM photographs of the sintered product. FIG. 4 is an SEM photograph at a low magnification (an image taken at a magnification of 3,000×) (a bar scale in the photograph represents 1 μm). FIG. 5 is an SEM photograph at a medium magnification (an image taken at a magnification of 5,000×) (a bar scale in the photograph represents 1 μm), and FIG. 6 is an SEM photograph at a high magnification (an image taken at a magnification of 10,000×) (a bar scale in the photograph represents 1 μm). In FIGS. 4, 5, and 6, black regions are the C phase, and white regions are the FePt alloy phase. As can be seen from FIGS. 4, 5, and 6, fine regions of the C phase are dispersed in the entire area of the structure.

Next, the size of the phase in the obtained sintered product (the cumulative number of ball mill revolutions: 4,073,760, sintering temperature: 1,340° C.) was determined by the intercept method.

Specifically, a total of five lines were drawn on the SEM photograph of the cross section of the target in FIG. 6 (an image taken at a magnification of 10,000×). More specifically, two horizontal lines were drawn on the SEM photograph of FIG. 6 in a left-right direction such that the image was divided vertically into thirds, and three vertical lines were drawn in a vertical direction such that the image was divided horizontally into quarters.

For each of the five lines, the total length of line segments intersecting the C phase and the number of the C phase intersected by the line were determined. Then the average of the lengths of the segments of the five lines that intersected the C phase was determined (by dividing the total length of the line segments intersecting the C phase by the number of the C phases intersected by the lines), and the obtained value was used as the average size of the C phase determined by the intercept method. The results showed that the average size of the C phase determined by the intercept method was 0.50 μm.

Example 3

The target compositions of a powder mixture and a target in Example 3 are 60(50Fe-50Pt)-40C. More specifically, the target composition of the metal components is 50 at % Fe-50 at % Pt, and the target compositional ratios of the FePt alloy and C (carbon) are 60 at % for the FePt alloy and 40 at % for C. In Examples 1 and 2, the target compositional ratio of C with respect to the total amount is 60 at %. Whereas, in Example 3, the target compositional ratio of C is 40 at %, and the content of C is smaller than that in Examples 1 and 2. However, as described later, since part of C (carbon) is volatilized during production of the powder mixture and during sintering of the target, the compositional ratios of the FePt alloy and C (carbon) in the powder mixture and target obtained slightly deviate from the target values. When the content of C (carbon) is represented not by at % but by vol %, the target compositions of the powder mixture and target in Example 3 are (50Fe-50Pt)-30.4 vol % C.

Example 3 is different from Example 2 in that the mixing container was filled with a gas mixture (Ar-20% $O_2$) and was sealed and the FePt powder and the C powder were mixed in the sealed mixing container, that the cumulative number of ball mill revolutions was changed, that the number of times and the timing of introduction of fresh air by opening the mixing container during mixing were changed, and that the sintering temperature during production of the sintered product was changed to 1,250° C. and 1,300° C.

A powder mixture and a sintered product were produced in the same manner as in Example 2 except for the above differences.

When the cumulative number of ball mill revolutions reached 290,520, 905,040, 1,195,560, 1,810,080, 2,246,400, and 3,181,680, the mixing container was opened, and whether or not ignition had occurred was visually checked. However, no ignition was found at each point.

The powder mixture mixed until the cumulative number of ball mill revolutions reached 1,810,080 was subjected to hot pressing under the conditions of temperature: 1,300° C., pressure: 25 MPa, time: 45 min., atmosphere: a vacuum of $5\times10^{-2}$ Pa or lower to thereby produce a sintered product. In addition, the powder mixture mixed until the cumulative number of ball mill revolutions reached 3,181,680 was subjected to hot pressing under the conditions of temperature: 1,250° C., 1,300° C., pressure: 25 MPa, time: 45 min., atmosphere: a vacuum of $5\times10^{-2}$ Pa or lower to thereby produce a sintered product.

The density of each of the produced sintered products was measured by the Archimedes method, and the measured value was divided by a theoretical density to determine the relative density. The results are shown in TABLE 7 below. The content of carbon in each sintered product shown in TABLE 8 was used as the amount of carbon used to compute the theoretical density, that is to say, the theoretical density was computed in consideration of a reduction in the amount of carbon during mixing and sintering.

TABLE 7

| Sintered powder mixture | Sintering temperature (° C.) | Density (g/cm³) | Theoretical density (g/cm³) | Relative density (%) |
|---|---|---|---|---|
| Powder mixture when cumulative number of ball mill revolutions was 1,810,080 | 1,300 | 11.83 | 11.83 | 100.0 |
| Powder mixture when cumulative number of ball mill revolutions was 3,181,680 | 1,250 | 11.44 | 11.80 | 96.9 |
| Powder mixture when cumulative number of ball mill revolutions was 3,181,680 | 1,300 | 11.42 | 12.00 | 95.2 |

The relative densities of the three sintered products were high, i.e., 100.0%, 96.9% and 95.2%, so that the amount of voids in each of the obtained sintered products was small.

The contents of oxygen and nitrogen in each of the sintered products molded by sintering of the powder mixtures shown in TABLE 7 at a sintering temperature of 1,250° C. or 1,300° C. were measured using a TC-600 Series Nitrogen/Oxygen Determinator manufactured by LECO Corporation, and the content of carbon was measured using a Carbon/Sulfur Analyzer manufactured by HORIBA, Ltd. The measurement results are shown in TABLE 8 below.

TABLE 8

| | Oxygen (mass %) | Nitrogen (mass ppm) | Carbon (mass %) |
|---|---|---|---|
| Sintered product (Cumulative number of ball mill revolutions: 181,080, Sintering temperature: 1,300° C.) | 17 | 0 | 5.29 |
| Sintered product (Cumulative number of ball mill revolutions: 3,181,680, Sintering temperature: 1,250° C.) | — | — | 5.38 |
| Sintered product (Cumulative number of ball mill revolutions: 3,181,680, Sintering temperature: 1,300° C.) | 9 | 1 | 4.97 |

As shown in TABLE 8, the contents of oxygen and nitrogen in the sintered products were very small.

Figure 7:
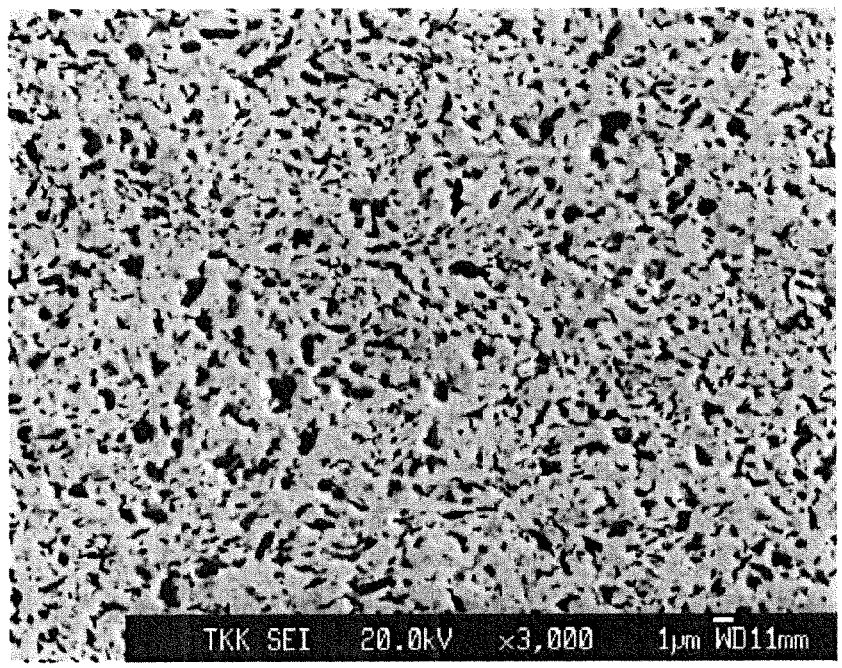
FIG. 7 is a low-magnification scanning electron micrograph (an image taken at a magnification of 3,000×) of the structure of a sintered product in Example 3 (the cumulative number of ball mill revolutions: 3,181,680, sintering temperature: 1,300° C.) (a bar scale in the photograph: 1 μm).
Figure 8:
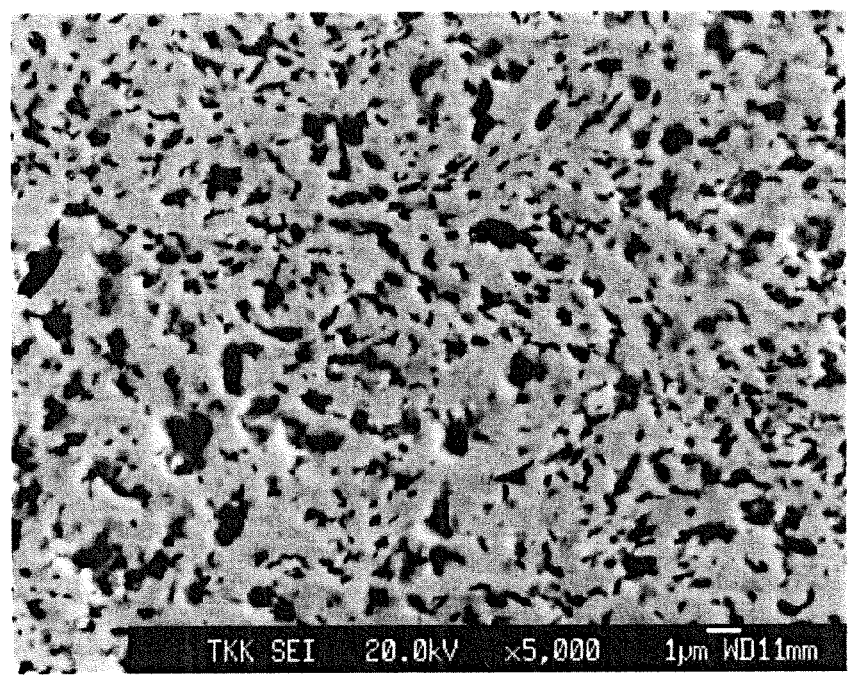
FIG. 8 is a medium-magnification scanning electron micrograph (an image taken at a magnification of 5,000×) of the structure of a sintered product in Example 3 (the cumulative number of ball mill revolutions: 3,181,680, sintering temperature: 1,300° C.) (a bar scale in the photograph: 1 μm).
Figure 9:
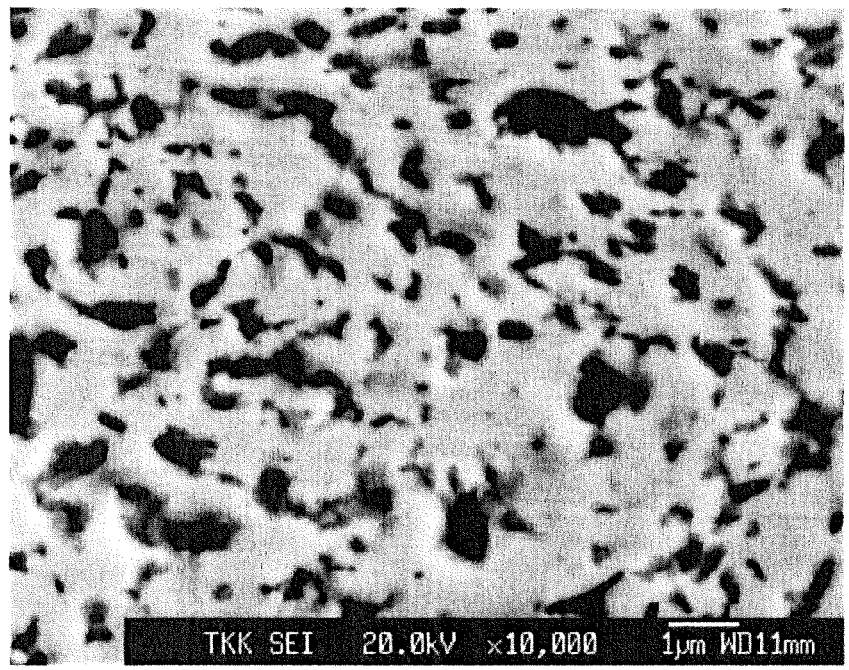
FIG. 9 is a high-magnification scanning electron micrograph (an image taken at a magnification of 10,000×) of the structure of a sintered product in Example 3 (the cumulative number of ball mill revolutions: 3,181,680, sintering temperature: 1,300° C.) (a bar scale in the photograph: 1 μm).

The structure of the obtained sintered product was observed under a scanning electron microscope (SEM). FIGS. 7, 8, and 9 show SEM photographs of the sintered product. FIG. 7 is an SEM photograph at a low magnification (an image taken at a magnification of 3,000×) (a bar scale in the photograph represents 1 μm). FIG. 8 is an SEM photograph at a medium magnification (an image taken at a magnification of 5,000×) (a bar scale in the photograph represents 1 μm), and FIG. 9 is an SEM photograph at a high magnification (an image taken at a magnification of 10,000×) (a bar scale in the photograph represents 1 μm). In FIGS. 7, 8, and 9, black regions are the C phase, and white regions are the FePt alloy phase. As can be seen from FIGS. 7, 8, and 9, fine regions of the C phase are dispersed in the entire area of the structure.

Next, the size of the phase in the obtained sintered product (the cumulative number of ball mill revolutions: 3,181,680, sintering temperature: 1,300° C.) was determined by the intercept method.

Specifically, a total of five lines were drawn on the SEM photograph of the cross section of the target in FIG. 9 (an image taken at a magnification of 10,000×). More specifically, two horizontal lines were drawn on the SEM photograph of FIG. 9 in a left-right direction such that the image was divided vertically into thirds, and three vertical lines were drawn in a vertical direction such that the image was divided horizontally into quarters.

For each of the five lines, the total length of line segments intersecting the C phase and the number of the C phase intersected by the line were determined. Then the average of the lengths of the segments of the five lines that intersected the C phase was determined (by dividing the total length of the line segments intersecting the C phase by the number of the C phases intersected by the lines), and the obtained value was used as the average size of the C phase determined by the intercept method. The results showed that the average size of the C phase determined by the intercept method was 0.33 μm.

Comparative Example 1

A powder mixture and a sintered product were produced in the same manner as in Example 3 except that the mixing container was filled with argon (Ar) and sealed and the FePt powder and the C powder were mixed in the sealed mixing container, that the cumulative number of ball mill revolutions was changed, that the number of times and the timing of introduction of fresh air by opening the mixing container during mixing were changed, and that the sintering temperature during production of the sintered product was changed to 1,100° C. In Comparative Example 1, the target compositions of the powder mixture and the target are the same as those in Example 3 and are 60(50Fe-50Pt)-40C. In Examples 1 and 2, the target compositional ratio of C with respect to the total amount is 60 at %. Whereas, in Comparative Example 1, the target compositional ratio of C is 40 at %, and the content of C is smaller than that in Examples 1 and 2.

When the cumulative number of ball mill revolutions reached 209,520, 608,040, 1,006,560, 1,405,080, 1,803,600, 2,202,120, and 2,816,640, the mixing container was opened, and whether or not ignition had occurred was visually checked. Until the point of time when the cumulative number of ball mill revolutions was 2,202,120, no ignition was found. However, at the point of time when the cumulative number of ball mill revolutions was 2,816,640, ignition was found.

To be precise, the atmosphere in the mixing container during mixing was the sealed gas mixture (Ar-20% $O_2$) atmosphere only in the initial stage of mixing (until the cumulative number of ball mill revolutions reached 209,520) and was a sealed argon (Ar) atmosphere thereafter. The mixing was performed in the sealed gas mixture (Ar-20% $O_2$) atmosphere only in the initial stage of mixing (until the cumulative number of ball mill revolutions reached 209,520). This cumulative number of ball mill revolutions is only 7.4% of the final cumulative number of ball mill revolutions, i.e., 2,816,640, so that the amount of oxygen adsorbed on the surface of the C powder in the initial stage of mixing (until the cumulative number of ball mill revolutions reached 209,520) is considered to be small. Therefore, Comparative Example 1 is thought to be an experimental example in which the FePt powder and the C particles having a certain amount or less of oxygen adsorbed thereon are mixed 2,816,640–209,520=2,607,120 times in the argon (Ar) atmosphere.

The powder mixture mixed until the cumulative number of ball mill revolutions reached 1,405,080 was subjected to hot pressing under the conditions of temperature: 1,100° C., pressure: 25 MPa, time: 45 min., atmosphere: a vacuum of $5\times10^{-2}$ Pa or lower to thereby produce a sintered product.

The density of each of the produced sintered products was measured by the Archimedes method, and the measured value was divided by a theoretical density to determine the relative density. The results are shown in TABLE 9 below. In Comparative Example 1, the theoretical density was not computed in consideration of a reduction in the amount of carbon during sintering, as was in Examples 1 to 3.

TABLE 9

| Sintered powder mixture | Sintering temperature (° C.) | Density (g/cm³) | Theoretical density (g/cm³) | Relative density (%) |
|---|---|---|---|---|
| Powder mixture when cumulative number of ball mill revolutions was 1,810,080 | 1,100 | 8.16 | 11.47 | 71.1 |

The relative density of the sintered product was low, i.e., 71.1%, so that the sintered product contained a large amount of voids. If the relative density is computed using the theoretical density computed in consideration of a reduction in the amount of carbon during sintering, the relative density in Comparative Example 1 may be much smaller than 71.1%.

Example 4

In Examples 1 to 3 and Comparative Example 1, the metal components are Fe and Pt forming a binary system. Whereas, in Example 4, the metal components are Fe, Pt, and Cu forming a ternary system.

The target compositions of a powder mixture and a target in Example 4 are 66.6(45Fe-45Pt-10Cu)-33.4C. More specifically, the target composition of the metal components is 45 at % Fe-45 at % Pt-10 at % Cu, and the target compositional ratios of the FePtCu alloy and C (carbon) are 66.6 at % for the FePtCu alloy and 33.4 at % for C. In Example 4, the content of C is smaller than that in Examples 1 to 3 and Comparative Example 1. However, as described later, since part of C (carbon) is volatilized during production of the powder mixture and during sintering of the target, the compositional ratios of the FePtCu alloy and C (carbon) in the powder mixture and target obtained slightly deviate from the target values. When the content of C (carbon) is represented not by at % but by vol %, the target compositions of the powder mixture and target in Example 4 are (45Fe-45Pt-10Cu)-25 vol % C.

In Example 4, as in Example 3, the mixing container was filled with a gas mixture (Ar-20% $O_2$) and then sealed, and FePtCu powder and the C powder were mixed in the sealed mixing container. However, the cumulative number of ball mill revolutions was different from that in Example 3, and the number of times and the timing of introduction of fresh air by opening the mixing container during mixing were different from those in Example 3. Another difference from Example 3 was that the sintering temperature during production of the sintered product was 1,350° C.

A powder mixture and a sintered product were produced in the same manner as in Example 3 except for the above differences.

When the cumulative number of ball mill revolutions reached 935,280, 1,870,560, 2,805,840, 4,073,760, and 5,674,320, the mixing container was opened, and whether or not ignition had occurred was visually checked. However, no ignition was found at each point.

Powder mixtures mixed until the cumulative number of ball mill revolutions reached 4,073,760 and 5,674,320 were subjected to hot pressing under the conditions of temperature: 1,350° C., pressure: 26.2 MPa, time: 45 min., atmosphere: a vacuum of $5\times10^{-2}$ Pa or lower to thereby produce sintered products.

The density of each of the produced sintered products was measured by the Archimedes method, and the measured value was divided by a theoretical density to determine the relative density. The results are shown in TABLE 10 below. The content of carbon in each sintered product shown in TABLE 11 was used as the amount of carbon used to compute the theoretical density, that is to say, the theoretical density was computed in consideration of a reduction in the amount of carbon during mixing and sintering.

TABLE 10

| Sintered powder mixture | Sintering temperature (° C.) | Density (g/cm³) | Theoretical density (g/cm³) | Relative density (%) |
|---|---|---|---|---|
| Powder mixture when cumulative number of ball mill revolutions was 4,073,760 | 1,350 | 10.82 | 11.75 | 92.1 |
| Powder mixture when cumulative number of ball mill revolutions was 5,674,320 | 1,350 | 11.33 | 11.75 | 96.4 |

The relative densities of the two sintered products were high, i.e., 92.1% and 96.4%, so that the amount of voids in each of the obtained sintered products was small.

The contents of oxygen and nitrogen in each of the sintered products molded by sintering of the powder mixtures shown in TABLE 11 at a sintering temperature of 1,350° C. were measured using a TC-600 Series Nitrogen/Oxygen Determinator manufactured by LECO Corporation, and the content of carbon was measured using a Carbon/Sulfur Analyzer manufactured by HORIBA, Ltd. The measurement results are shown in TABLE 11 below.

TABLE 11

| Sintered powder mixture | Oxygen (mass %) | Nitrogen (mass ppm) | Carbon (mass %) |
|---|---|---|---|
| Powder mixture when cumulative number of ball mill revolutions was 4,073,760 | 536 | — | 4.00 |
| Powder mixture when cumulative number of ball mill revolutions was 5,674,320 | 293 | — | 3.83 |

As shown in TABLE 11, the contents of oxygen in the sintered products were very small.

Figure 10:
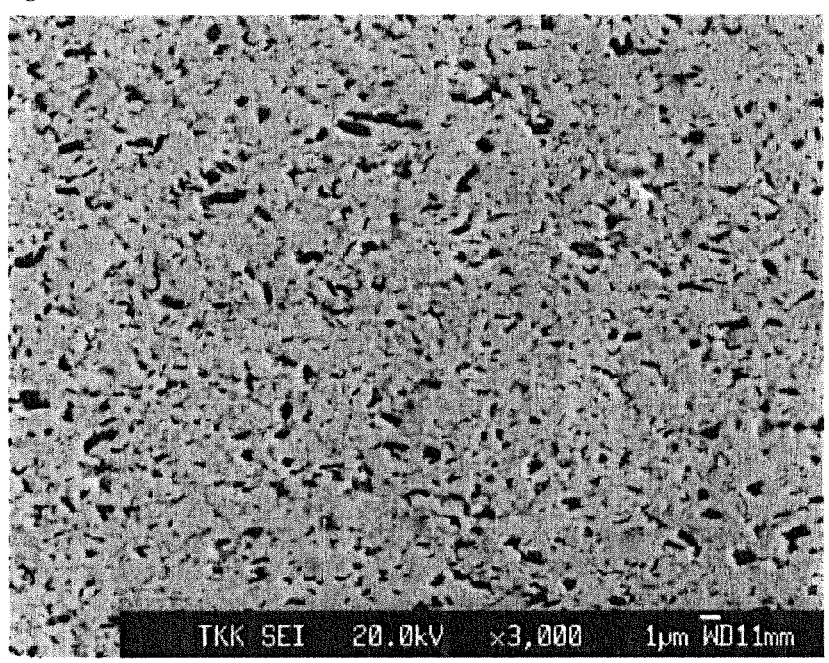
FIG. 10 is a low-magnification scanning electron micrograph (an image taken at a magnification of 3,000×) of the structure of a sintered product in Example 4 (the cumulative number of ball mill revolutions: 3,181,680, sintering temperature: 1,300° C.) (a bar scale in the photograph: 1 μm).
Figure 11:
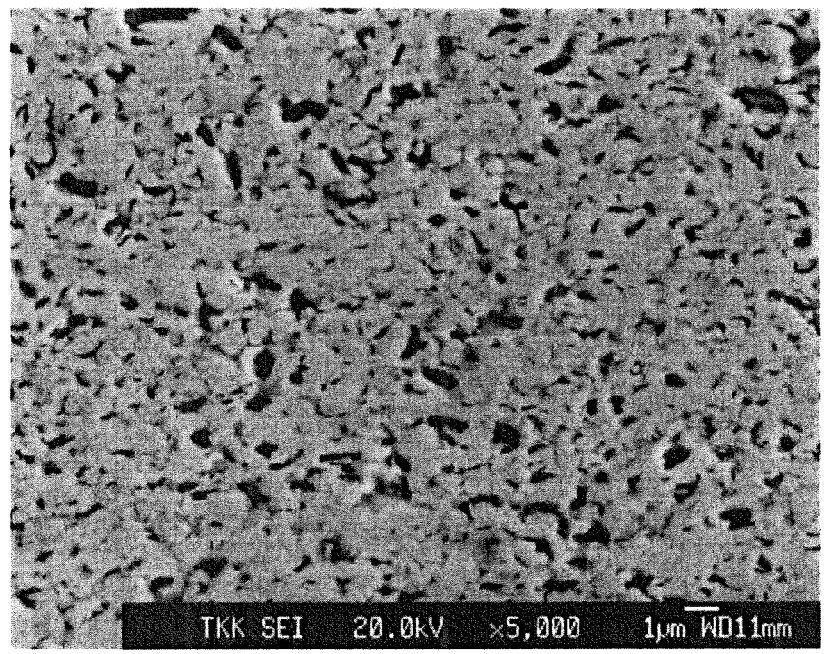
FIG. 11 is a medium-magnification scanning electron micrograph (an image taken at a magnification of 5,000×) of the structure of a sintered product in Example 4 (the cumulative number of ball mill revolutions: 3,181,680, sintering temperature: 1,300° C.) (a bar scale in the photograph: 1 μm).
Figure 12:
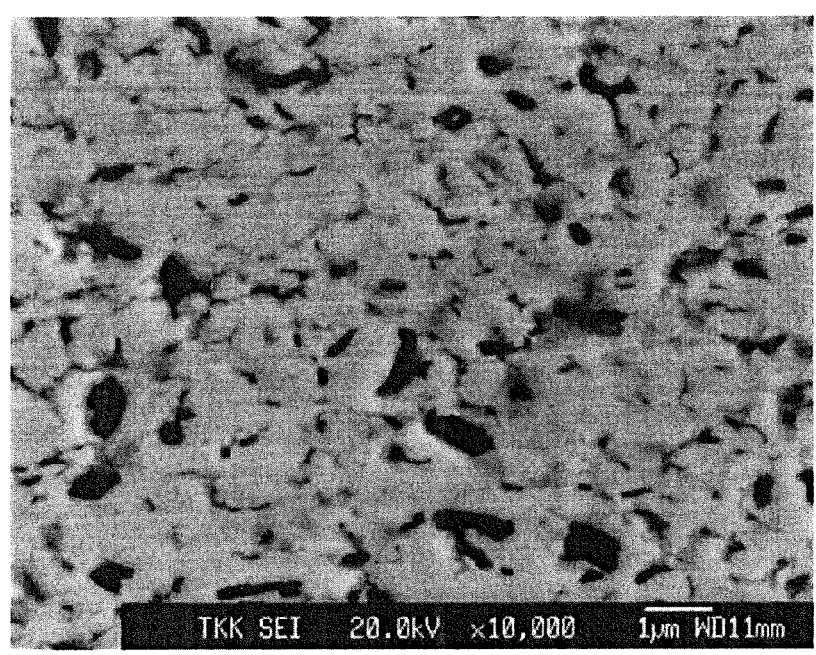
FIG. 12 is a high-magnification scanning electron micrograph (an image taken at a magnification of 10,000×) of the structure of a sintered product in Example 4 (the cumulative number of ball mill revolutions: 3,181,680, sintering temperature: 1,300° C.) (a bar scale in the photograph: 1 μm).

The structure of the obtained sintered product was observed under a scanning electron microscope (SEM). FIGS. 10, 11, and 12 show SEM photographs of the sintered product. FIG. 10 is an SEM photograph at a low magnification (an image taken at a magnification of 3,000×) (a bar scale in the photograph represents 1 μm). FIG. 11 is an SEM photograph at a medium magnification (an image taken at a magnification of 5,000×) (a bar scale in the photograph represents 1 μm), and FIG. 12 is an SEM photograph at a high magnification (an image taken at a magnification of 10,000×) (a bar scale in the photograph represents 1 μm). In FIGS. 10, 11, and 12, black regions are the C phase, and white regions are the FePt alloy phase. As can be seen from FIGS. 10, 11, and 12, fine regions of the C phase are dispersed in the entire area of the structure.

Next, the size of the phase in the obtained sintered product (the cumulative number of ball mill revolutions: 5,674,320, sintering temperature: 1,350° C.) was determined by the intercept method.

Specifically, a total of five lines were drawn on the SEM photograph of the cross section of the target in FIG. 12 (an image taken at a magnification of 10,000×). More specifically, two horizontal lines were drawn on the SEM photograph of FIG. 12 in a left-right direction such that the image was divided vertically into thirds, and three vertical lines were drawn in a vertical direction such that the image was divided horizontally into quarters.

For each of the five lines, the total length of line segments intersecting the C phase and the number of the C phase intersected by the line were determined. Then the average of the lengths of the segments of the five lines that intersected the C phase was determined (by dividing the total length of the line segments intersecting the C phase by the number of the C phases intersected by the lines), and the obtained value was used as the average size of the C phase determined by the intercept method. The results showed that the average size of the C phase determined by the intercept method was 0.25 μm.

(Discussion)

The principal experimental data in Examples 1 to 4 and Comparative Example 1 is summarized in TABLE 12 below.

containing no oxygen during a period from when the cumulative number of ball mill revolutions was 209,521 to when it reached 2,816,640, ignition was found when the mixing container was opened at the point of time when the cumulative number of ball mill revolutions was 2,816,640.

In Examples 1 to 4, the sintered products were produced using powder mixtures mixed until the cumulative number of ball mill revolutions exceeded 2,800,000, and the relative density of each of the produced sintered products was 92% or higher. Whereas, in Comparative Example 1, the sintered product was produced using the powder mixture mixed until the cumulative number of ball mill revolutions reached 1,405,080, and the relative density of the produced sintered product was small, i.e., 71.1%. One reason for this may be the influence of low sintering temperature, 1,100° C., in Comparative Example 1. Another reason may be that, since the cumulative number of ball mill revolutions was small, the particle diameter of the C powder in the powder mixture used to produce the sintered product was not sufficiently reduced, so that voids in the sintered product became large and the relative density of the sintered product became small.

In Examples 1, 2, 3, and 4, the sizes of the C phase in the obtained targets were measured by the intercept method. The sizes of the C phase were smaller than 0.6 μm, i.e., 0.52 μm, 0.50 μm, 0.33 μm, and 0.25 μm, respectively, and were found to be sufficiently reduced.

The size of the C phase in the obtained target was 0.52 μm and 0.50 μm in Examples 1 and 2 in which the content of C in the target was 60 at %, 0.33 μm in Example 3 in which the content of C in the target was 40 at %, and 0.25 μm in Example 4 in which the content of C in the target was 33.4 at %. The size of the C phase decreases as the content of C decreases. This may be because, when the content of C is large, regions of the C phase are easily connected, so that the size of the C phase is less likely to decrease.

TABLE 12

| | Type of alloy | Target C content (at %) | Atmosphere during mixing | Cumulative number of ball mill revolutions (Number) | Sintering temperature (° C.) | Relative density (%) | Ignition | Average size of C phase (μm) |
|---|---|---|---|---|---|---|---|---|
| Example 1 | FePt | 60 | Circulating air | 4,136,400 | 1,460 | 96.4 | NO | 0.52 |
| Example 2 | FePt | 60 | Sealed air | 2,805,840 | 1,380 | 93.4 | NO | — |
| | | | | 4,073,760 | 1,340 | 92.0 | NO | 0.50 |
| Example 3 | FePt | 40 | Ar + O$_2$ | 1,810,080 | 1,300 | 100 | NO | — |
| | | | | 3,181,680 | 1,250 | 96.9 | NO | — |
| | | | | 3,181,680 | 1,300 | 95.2 | NO | 0.33 |
| Comparative example 1 | FePt | 40 | Ar | 1,405,080 | 1,100 | 71.1 | NO | — |
| | | | | 2,816,640 | — | — | YES | — |
| Example 4 | FePtCu | 33.4 | Ar + O$_2$ | 5,674,320 | 1,350 | 96.4 | NO | 0.25 |

In Examples 1 to 3, the entire process for mixing the FePt powder and the C powder was performed in an atmosphere containing oxygen. In Example 4, the entire process for mixing the FePtCu powder and the C powder was performed in an atmosphere containing oxygen. In Example 1, no ignition was found even after the cumulative number of ball mill revolutions reached 4,136,400. In Example 2, no ignition was found even after the cumulative number of ball mill revolutions reached 4,073,760. In Example 3, no ignition was found even after the cumulative number of ball mill revolutions reached 3,181,680. In Example 4, no ignition was found even after the cumulative number of ball mill revolutions reached 5,674,320.

Whereas, in Comparative Example 1 in which the FePt powder and the C powder were mixed in an argon atmosphere

INDUSTRIAL APPLICABILITY

The target according to the present invention can be preferably used as an FePt—C-based sputtering target. The production process according to the present invention can be preferably used as a process for producing an FePt—C-based sputtering target.

What is claimed is:
1. A process for producing an FePt—C-based sputtering target, comprising:
   adding C powder containing unavoidable impurities to FePt-based alloy powder containing Pt in an amount of 40 at % or more and 60 at % or less with the balance being Fe and unavoidable impurities;

mixing the C powder and the FePt-based alloy powder in an atmosphere containing oxygen to produce a powder mixture; and then molding the produced powder mixture while the powder mixture is heated under pressure.

2. The process for producing an FePt—C-based sputtering target according to claim 1, wherein the C powder is added such that C is contained in an amount of 21 at % or more and 70 at % or less based on the total amount of the powder mixture.

3. The process for producing an FePt—C-based sputtering target according to claim 1, wherein oxygen is supplied to the atmosphere from outside of the atmosphere.

4. The process for producing an FePt—C-based sputtering target according to claim 3, wherein the oxygen is supplied by supplying air.

5. The process for producing an FePt—C-based sputtering target according to claim 1, wherein the atmosphere is air.

6. The process for producing an FePt—C-based sputtering target according to claim 1, wherein the atmosphere is composed substantially of an inert gas and oxygen.

7. The process for producing an FePt—C-based sputtering target according to claim 1, wherein a concentration of oxygen in the atmosphere is 10 vol % or higher and 30 vol % or lower.

8. The process for producing an FePt—C-based sputtering target according to claim 1, wherein the atmosphere is released to air during the mixing.

9. The process for producing an FePt—C-based sputtering target according to claim 1, wherein a C phase in the obtained FePt—C-based sputtering target has an average phase size of 0.6 µm or less as determined by an intercept method.

10. The process for producing an FePt—C-based sputtering target according to claim 1, wherein an atmosphere when the powder mixture is molded while heated under pressure is a vacuum or an inert gas atmosphere.

11. The process for producing an FePt—C-based sputtering target according to claim 1, wherein oxygen in the obtained FePt—C-based sputtering target is contained in an amount of 100 mass ppm or less.

12. The process for producing an FePt—C-based sputtering target according to claim 1, wherein nitrogen in the obtained FePt—C-based sputtering target is contained in an amount of 30 mass ppm or less.

13. The process for producing an FePt—C-based sputtering target according to claim 1, wherein the FePt-based alloy powder is produced by an atomizing method.

14. The process for producing an FePt—C-based sputtering target according to claim 13, wherein the atomizing method is performed using argon gas or nitrogen gas.

15. The process for producing an FePt—C-based sputtering target according to claim 1, wherein the obtained FePt—C-based sputtering target is used for a magnetic recording medium.

16. A process for producing an FePt—C-based sputtering target, comprising:

adding C powder containing unavoidable impurities to FePt-based alloy powder containing Pt in an amount of 40 at % or more and less than 60 at % and one or more kinds of metal elements other than Fe and Pt in an amount of more than 0 at % and 20 at % or less with the balance being Fe and unavoidable impurities and with the total amount of Pt and the one or more kinds of metal elements being 60 at % or less;

mixing the C powder and the FePt-based alloy powder in an atmosphere containing oxygen to produce a powder mixture; and then molding the produced powder mixture while the powder mixture is heated under pressure.

17. The process for producing an FePt—C-based sputtering target according to claim 16, wherein the one or more kinds of metal elements other than Fe and Pt are one or more kinds of Cu, Ag, Mn, Ni, Co, Pd, Cr, V, and B.

18. The process for producing an FePt—C-based sputtering target according to claim 16, wherein the one or more kinds of metal elements other than Fe and Pt include Cu.

19. The process for producing an FePt—C-based sputtering target according to claim 16, wherein the one or more kinds of metal elements other than Fe and Pt are only Cu.

20. The process for producing an FePt—C-based sputtering target according to claim 16, wherein the C powder is added such that C is contained in an amount of 21 at % or more and 70 at % or less based on the total amount of the powder mixture.

21. The process for producing an FePt—C-based sputtering target according to claim 16, wherein oxygen is supplied to the atmosphere from outside of the atmosphere.

22. The process for producing an FePt—C-based sputtering target according to claim 21, wherein the oxygen is supplied by supplying air.

23. The process for producing an FePt—C-based sputtering target according to claim 16, wherein the atmosphere is air.

24. The process for producing an FePt—C-based sputtering target according to claim 16, wherein the atmosphere is composed substantially of an inert gas and oxygen.

25. The process for producing an FePt—C-based sputtering target according to claim 16, wherein a concentration of oxygen in the atmosphere is 10 vol % or higher and 30 vol % or lower.

26. The process for producing an FePt—C-based sputtering target according to claim 16, wherein the atmosphere is released to air during the mixing.

27. The process for producing an FePt—C-based sputtering target according to claim 16, wherein a C phase in the obtained FePt—C-based sputtering target has an average phase size of 0.6 µm or less as determined by an intercept method.

28. The process for producing an FePt—C-based sputtering target according to claim 16, wherein an atmosphere when the powder mixture is molded while heated under pressure is a vacuum or an inert gas atmosphere.

29. The process for producing an FePt—C-based sputtering target according to claim 16, wherein oxygen in the obtained FePt—C-based sputtering target is contained in an amount of 100 mass ppm or less.

30. The process for producing an FePt—C-based sputtering target according to claim 16, wherein nitrogen in the obtained FePt—C-based sputtering target is contained in an amount of 30 mass ppm or less.

31. The process for producing an FePt—C-based sputtering target according to claim 16,
wherein the FePt-based alloy powder is produced by an atomizing method.

32. The process for producing an FePt—C-based sputtering target according to claim 31,
wherein the atomizing method is performed using argon gas or nitrogen gas.

33. The process for producing an FePt—C-based sputtering target according to claim 16,
wherein the obtained FePt—C-based sputtering target is used for a magnetic recording medium.

* * * * *